(12) United States Patent
Viswanathan et al.

(10) Patent No.: US 10,269,678 B1
(45) Date of Patent: Apr. 23, 2019

(54) MICROELECTRONIC COMPONENTS HAVING INTEGRATED HEAT DISSIPATION POSTS, SYSTEMS INCLUDING THE SAME, AND METHODS FOR THE FABRICATION THEREOF

(71) Applicant: NXP USA, INC., Austin, TX (US)

(72) Inventors: Lakshminarayan Viswanathan, Phoenix, AZ (US); Mahesh K. Shah, Scottsdale, AZ (US); Lu Li, Gilbert, AZ (US); David Abdo, Scottsdale, AZ (US); Geoffrey Tucker, Tempe, AZ (US); Carl Emil D'Acosta, Mesa, AZ (US); Jaynal A. Molla, Gilbert, AZ (US); Justin Eugene Poarch, Gilbert, AZ (US); Paul Hart, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/832,479

(22) Filed: Dec. 5, 2017

(51) Int. Cl.
*H01L 21/48* (2006.01)
*H01L 23/00* (2006.01)
(Continued)

(52) U.S. Cl.
CPC ........ *H01L 23/367* (2013.01); *H01L 21/4853* (2013.01); *H01L 21/4867* (2013.01); *H01L 21/4882* (2013.01); *H01L 23/13* (2013.01); *H01L 23/5286* (2013.01); *H01L 24/29* (2013.01); *H01L 24/73* (2013.01); *H01L 24/83* (2013.01); *H01L 2023/405* (2013.01); *H01L 2023/4043* (2013.01); *H01L 2023/4062* (2013.01); *H01L 2224/29239* (2013.01); *H01L 2224/29244* (2013.01); *H01L 2224/29247* (2013.01); *H01L 2224/73265* (2013.01); *H01L 2224/8384* (2013.01)

(58) Field of Classification Search
CPC ... H01L 21/4882; H01L 23/34; H01L 23/367; H01L 23/3675; H01L 2023/4043; H01L 2023/405; H01L 2023/4062
See application file for complete search history.

(56) References Cited

U.S. PATENT DOCUMENTS 5,285,352 A * 2/1994 Pastore .................. H01L 23/36
165/185
5,583,377 A * 12/1996 Higgins, III ............ H01L 23/13
257/706

(Continued)

*Primary Examiner* — David A Zarneke

(57) ABSTRACT

Microelectronic systems having integrated heat dissipation posts are disclosed, as are methods for fabricating such microelectronic systems. In various embodiments, the method includes the step or process of obtaining a microelectronic component from which a heat dissipation post projects. The microelectronic component is placed or seated on a substrate, such as a multilayer printed circuit board, having a socket cavity therein. The heat dissipation post is received in the socket cavity as the microelectronic component is seated on the substrate. Concurrent with or after seating the microelectronic component, the microelectronic component and the heat dissipation post are bonded to the substrate. In certain embodiments, the heat dissipation post may be dimensioned or sized such that, when the microelectronic component is seated on the substrate, the heat dissipation post occupies a volumetric majority of the socket cavity.

16 Claims, 6 Drawing Sheets

(51) Int. Cl.
*H01L 23/13* (2006.01)
*H01L 23/40* (2006.01)
*H01L 23/367* (2006.01)
*H01L 23/528* (2006.01)

(56) References Cited

U.S. PATENT DOCUMENTS

| | | | |
|---|---|---|---|
| 5,779,134 A | 7/1998 | Watson et al. | |
| 5,856,911 A * | 1/1999 | Riley | G06F 1/203 |
| | | | 174/16.3 |
| 6,882,042 B2 | 4/2005 | Zhao et al. | |
| 7,102,225 B2 | 9/2006 | Khan et al. | |
| 7,227,256 B2 | 6/2007 | Zhao et al. | |
| 7,462,933 B2 * | 12/2008 | Zhao | H01L 23/24 |
| | | | 257/706 |
| 7,579,217 B2 | 8/2009 | Zhao et al. | |
| 8,472,190 B2 * | 6/2013 | Refai-Ahmed | H01L 23/13 |
| | | | 361/704 |
| 8,686,558 B2 | 4/2014 | Zhao et al. | |
| 9,331,058 B2 * | 5/2016 | Bruno | H01L 23/13 |
| 9,763,317 B2 | 9/2017 | Mass et al. | |
| 9,947,612 B2 * | 4/2018 | Talledo | H01L 21/563 |
| 10,141,182 B1 * | 11/2018 | Molla | H01L 21/02109 |

* cited by examiner

US 10,269,678 B1

MICROELECTRONIC COMPONENTS HAVING INTEGRATED HEAT DISSIPATION POSTS, SYSTEMS INCLUDING THE SAME, AND METHODS FOR THE FABRICATION THEREOF

TECHNICAL FIELD

Embodiments of the present disclosure relate generally to microelectronic systems and, more particularly, to heat-generating microelectronic components including integrated heat dissipation posts, microelectronic systems containing such components, and methods for the fabrication thereof.

ABBREVIATIONS

Abbreviations appearing less frequently in this document are defined upon initial usage, while abbreviations appearing with greater frequency are defined below.
Ag—Silver;
Al—Aluminum;
Au—Gold;
CTE—Coefficient of Thermal Expansion;
Cu—Copper;
IC—Integrated Circuit;
PAM—Power Amplification Module;
PCB—Printed Circuit Board;
RF—Radio Frequency;
Wt %—Weight percent; and
° C.—degrees Celsius.

BACKGROUND

Microelectronic systems commonly contain power devices prone to the generation of excess heat during operation, particularly when such devices operate at higher power levels and, when applicable, at higher RF frequencies. In the absence of an adequate means for removing excess heat from the system, undesirably elevated temperatures or "hot spots" can occur at localized regions within the microelectronic system and the power device or devices contained therein. Such elevated localized temperatures can detract from device performance and degrade the reliability of the microelectronic system by accelerating common failure modes, such as solder joint fatigue. For this reason, microelectronic systems containing power devices are commonly fabricated utilizing embedded coined substrates; that is, substrates incorporating metal slugs or "coins" as dedicated mount structures having relatively high thermal conductivities. By attaching a power device or a module containing power device(s) to an embedded coin, excess heat concentrations may be more effectively dissipated to enhance the thermal performance of the microelectronic system.

While generally having improved heat dissipation capabilities, microelectronic systems fabricated utilizing embedded coin substrates remain limited in certain regards. The manufacturing processes utilized to fabricate coined substrates are often relatively complex, costly, and may involve exposure to elevated processing temperatures at which substrate warpage and other deleterious effects can occur. Manufacturing cost and complexity further increase when utilizing an embedded coin for electrical interconnection purposes; e.g., to electrically couple a ground pad of a power device or device-containing microelectronic component to a ground layer contained within the substrate. To provide a specific example, certain multilayer PCBs are now fabricate to include embedded coins and ring-shaped clusters of vias commonly referred to as "via farms," which extend through the upper PCB layers to connect the embedded coins to electrical ground within the PCB. Fabricating an embedded coin substrate in this manner can reduce PCB manufacturing costs, while providing a reliable connection between the embedded coin and a ground layer within the PCB; however, embedded coin PCBs of this type remain undesirably costly to produce and do little to enhance the overall heat dissipation capabilities of the microelectronic system.

Setting aside the manufacturing-related limitations above, microelectronic systems fabricated utilizing embedded coin substrates remain limited in other respects, as well. As conventionally designed and fabricated, such systems typically rely solely or exclusively upon legacy materials, such as solder materials, to attach heat-generating microelectronic components to the upper surfaces of coins embedded within a particular PCB or substrate. While acceptable in many, if not most applications, the thermal conductivities and temperature tolerances of such materials can be undesirably restrictive in the context of high power and high frequency applications, such as certain RF applications. Consequently, the integration of conventional embedded coined substrates into microelectronic systems containing power devices again provides a suboptimal heat dissipation solution. Highly elevated local temperatures may still occur at certain junctures within the thermal stack (that is, the various layers of materials through which conductive heat flow is desired) in a manner exacerbating failure modes of the microelectronic system when operated at higher power levels and/or at higher operational frequencies.

BRIEF DESCRIPTION OF THE DRAWINGS

At least one example of the present invention will hereinafter be described in conjunction with the following figures, wherein like numerals denote like elements, and.

Figure 1:
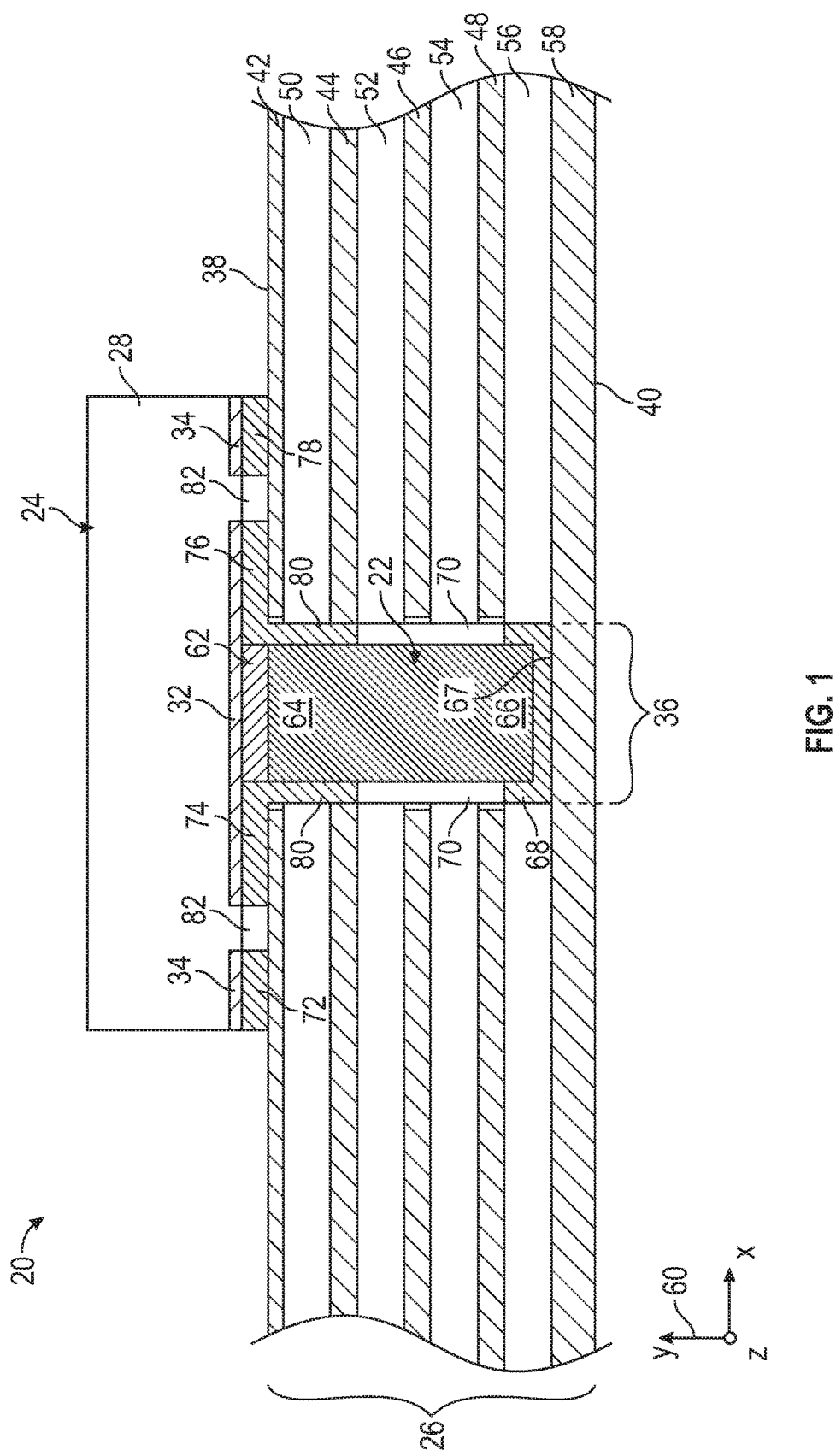
FIG. 1 is cross-sectional view of a microelectronic system including a heat-generating microelectronic component to which an integrated heat dissipation post is bonded, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect. As appearing herein, a structure, body, material, or layer is considered "thermally-conductive" when the structure, body, material, or layer has a thermal conductivity exceeding 5 watts per meter-Kelvin (W/mK).

APPLICATIONS INCORPORATED BY REFERENCE

The following applications are owned by the present assignee at the time of filing this document with the United States Patent and Trademark Office (USPTO), generally relate to the present subject matter to varying degrees, and are hereby incorporated by reference: U.S. patent application Ser. No. 15/223,307, filed with the USPTO on Jul. 29, 2016, and entitled "SINTERED MULTILAYER HEATSINKS FOR MICROELECTRONIC PACKAGES AND METHODS FOR THE PRODUCTION THEREOF"; U.S. patent application Ser. No. 15/269,629, filed with the USPTO on Sep. 19, 2016, and entitled "AIR CAVITY PACKAGES AND METHODS FOR THE PRODUCTION THEREOF"; U.S. patent application Ser. No. 15/364,671, filed with the USPTO on Nov. 29, 2016, and entitled "MICROELECTRONIC MODULES WITH SINTER-BONDED HEAT DISSIPATION STRUCTURES AND METHODS FOR THE FABRICATION THEREOF"; U.S. patent application Ser. No. 15/670,429, filed with the USPTO on Aug. 7, 2017, and entitled "MOLDED AIR CAVITY PACKAGES AND METHODS FOR THE PRODUCTION THEREOF."

Overview

The following describes heat-generating microelectronic components including integrated heat dissipation posts, microelectronic systems containing such components, and related manufacturing methods. As appearing herein, the term "heat dissipation post" refers to a thermally-conductive body or structure promoting conductive heat flow away from one or more heat-generating devices. In certain embodiments, the heat dissipation post may further provide desired electrical interconnections. The word "post," as appearing in the term "heat dissipation post," is further utilized to indicate that the heat dissipation post assumes the form of a body or structure projecting from the microelectronic device or package to which the post is joined at its proximal end. Usage of the word "post" does not restrict a heat dissipation post to having any particular form factor, disposition, or size. Finally, as further appearing herein, the term "integrated" denotes that a given heat dissipation post is joined to or incorporated into a microelectronic package or device prior to attachment of the microelectronic package or device to a substrate having an opening in which the post is received. A given integrated heat dissipation post may be a discretely-fabricated piece or structure, which is joined to a microelectronic device or package by bonding. Alternatively, a heat dissipation post may be joined to a microelectronic package by integral formation with a thermal pad or flange further incorporated into the package.

A microelectronic system is formed when a microelectronic device or package is mounted to and possibly electrically interconnected with a supportive substrate, such as a multilayer PCB. As indicated above, the substrate includes at least one aperture, tunnel, or opening, which receives the heat dissipation post therein and which is generically referred to as a "socket cavity." In embodiments, the socket cavity may extend fully through a given substrate and, therefore, penetrate both the substrate frontside and backside. Alternatively, a given socket cavity may be blind such that the cavity penetrates the substrate frontside, while terminating at a particular depth within the substrate. For example, in certain implementations, the socket cavity may terminate at a thermally-conductive layer of the substrate, such as a backside metal layer, which forms a floor of the socket cavity. When the heat dissipation post is inserted into the socket cavity, the distal end of the heat dissipation post may be positioned adjacent the cavity floor, while being separated therefrom by an axial gap. A thermally-conductive bond layer may fill this axial gap, at least in substantial part, to mechanically, thermally, and possibly electrically couple the distal post end to the cavity floor. In this manner, excess heat generated by the microelectronic component can be efficiently removed through the heat dissipation post and transferred to the backside metal layer (or other thermally-conductive layer of the substrate) to spread the heat over a greater volume of material for further thermal performance enhancements. Additional description of integrated heat dissipation posts and other features contained within an exemplary microelectronic system will now be set-forth in conjunction with FIGS. 1-3.

Example of Microelectronic System Containing Component Having Integrated Heat Dissipation Post FIG. 1 is a simplified, cross-sectional view of a microelectronic system 20 including an integrated heat dissipation post 22, as illustrated in accordance with an exemplary embodiment of the present disclosure. In addition to integrated heat dissipation post 22, microelectronic system 20 includes at least one heat-generating microelectronic component 24 and a substrate 26, such as a multilayer PCB, to which microelectronic component 24 is mounted. While only a limited portion of microelectronic system 20 is shown in FIG. 1, the non-illustrated portions of microelectronic system 20 can contain various other features, which may be similar to or vary relative to the illustrated features of system 20. For example, the non-illustrated regions of microelectronic system 20 may support other microelectronic components, such as other microelectronic (e.g., PAM) packages, passive devices, or bare semiconductor die, which may be interconnected with microelectronic component 24 via the routing features of substrate 26, utilizing wire bonds, or in another manner.

Heat-generating microelectronic component 24 can be any microelectronic device or device-containing package prone to excess heat generation during operation. In certain instances, microelectronic component 24 can be an unpackaged or bare semiconductor die carrying one or more ICs, which provide signal amplification, processing, memory, and/or RF functionalities. Alternatively, microelectronic component 24 can assume the form of a Microelectromechanical Systems (MEMS) device, a power transistor die or packaged device, an amplifier, an optical device, a passive device, an inverter switch, an RF antenna structure, or other small scale electronic device prone to excess heat generation. As a further possibility, microelectronic component 24 can be realized as a microelectronic package or module containing one or more RF devices, such as power semiconductor die carrying ICs having RF functionalities. For example, in embodiments in which component 24 assumes the form of a PAM package, microelectronic component 24 may contain a molded package body 28, which houses at least one power transistor die carrying RF amplification circuitry. Microelectronic component 24 has dual flat non-lead form factor in the illustrated example, but can have various other form factors in further embodiments. Accordingly, component 24 contains a number of I/O terminals 34, which are spaced in rows on opposing sides of a central ground pad 32. Ground pad 32 may serve as an electrically-active terminal or heatsink of microelectronic component 24, which provides both grounding and heat removal from the power device(s) within component 24.

Substrate 26 can assume any form suitable for supporting heat-generating microelectronic component 24 and including at least one opening or socket cavity 36 in which integrated heat dissipation post 22 is received. Substrate 26 may or may not contain electrically-conductive routing features, such as wiring layers or metal levels, layer-to-layer electrical connections (e.g., as provided by electrically-conductive vias or metal plugs), and other such features for conducting electrical signals, applying voltages, or otherwise carrying electrical current. In the illustrated example, substrate 26 is realized as a multilayer PCB having a frontside 38 and an opposing backside 40. A first patterned metal layer 42 is provided along substrate frontside 38 and defines traces, pads, and similar electrically-conductive features in electrical communication with the circuitry of microelectronic component 24 and, perhaps, other microelectronic components contained within system 20. Three internal wiring layers or patterned metal levels 44, 46, 48 are present within substrate 26 and interspersed with four dielectric layers 50, 52, 54, 56. In other embodiments, substrate 26 may have a greater or lesser number of wiring layers; or may assume a different form, such as that of a coreless substrate or an interposer including or lacking routing features. Substrate 26 may or may not have backside metallization; that is, patterned traces formed along backside 40. Similarly, a relatively thick, continuous metal (e.g., Cu) layer 58 can be provided at backside 40 of substrate 26 for enhanced heat spreading and/or electrical grounding purposes, as desired.

Socket cavity 36 may be formed in a central portion of substrate 26, although the location of cavity 36 may vary amongst embodiments along with cavity shape, dimensions, and the number of socket cavities formed in substrate 26. Socket cavity 36 can be produced in-situ during the PCB lamination process or subsequent thereto utilizing a material removal process, such as laser or mechanical drilling. The interior sidewalls of substrate 26 defining socket cavity 36 (herein, the "inner cavity sidewalls") may be left bare or instead covered by a selected plating or coating material; e.g., in one embodiment, the inner cavity walls are partially or wholly plated with a metallic (e.g., Au) film, which may enhance metallurgical bonding with one or more of layers 68, 74, 76 described below. Socket cavity 36 may have planform dimensions (e.g., a width, length, or diameter) less than those of microelectronic component 24 and, perhaps, substantially equivalent to or less than the planform dimensions of ground pad 32. In various embodiments, socket cavity 36 may have a rectangular planform geometry when viewed from a top-down perspective; that is, along the Y-axis of coordinate legend 60 in FIG. 1. In other embodiments, socket cavity 36 may have other planform shapes, such as ovular, racetrack, circular, and more complex polygonal shapes, to list but a few examples.

Integrated heat dissipation post 22 extends into socket cavity 36 and may be substantially co-axial therewith. In one embodiment, integrated heat dissipation post 22 and socket cavity 36 are each substantially co-axial with the centerline of microelectronic system 20. Integrated heat dissipation post 22 may be formed to have an longitudinally-elongated form factor in an embodiment; that is, such that the maximum dimension of heat dissipation post 22 is the post length, as taken along the longitudinal axis of post 22 (corresponding to the Y-axis of coordinate legend 60 shown in the lower left corner of FIG. 1). In other embodiments, integrated heat dissipation post 22 may have a different geometry and, perhaps, may have a maximum dimension extending in a different direction, such as along the X- or Z-axis of coordinate legend 60. Regardless of its particular geometry, integrated heat dissipation post 22 is beneficially sized or dimensioned to occupy the volumetric majority or, perhaps, the substantial entirety of socket cavity 36. In other implementations, heat dissipation post 22 may occupy a volumetric minority of socket cavity 36 as may be the case when, for example, cavity 36 receives multiple heat dissipation posts or other structures therein. Finally, microelectronic component 24 may be dimensioned such that, when seated on and bonded to substrate 26, component covers 24 covers socket cavity 36, at least in substantial part, as seen from frontside 38 of substrate 26.

Integral heat dissipation post 22 has a proximal end portion 64 and an opposing distal end portion 66; the terms "proximal" and "distal," as appearing herein in connection with heat dissipation post 22, defined based upon relative proximity to microelectronic component 24. End portions 64, 66 are opposed along the longitudinal axis or centerline of heat dissipation post 22; again, corresponding to the Y-axis of coordinate legend 60 or an axis orthogonal to frontside 38 of substrate 26. Proximal end portion 64 may be positioned immediately beneath a central portion of microelectronic component 24, as taken along the longitudinal axis or centerline of post 22. In certain embodiments, proximal end portion 64 may physically contact microelectronic component 24 and, specifically, ground pad 32. In such embodiments, proximal end portion 64 and, more broadly, heat dissipation post 22 may be integrally formed with ground pad 32. Further description in this regard is provided below in conjunction with FIG. 6. Alternatively, as shown in FIG. 1, heat dissipation post 22 may produced as a discrete piece or structure, which is then bonded to ground pad 32 (or another surface of component 24) at proximal end portion 64 of post 22. In this latter case, an intervening bond layer 62 (discussed below as a "thermally-conductive proximal bond layer") may be present at the juncture between proximal end portion 64 of heat dissipation post 22 and the lowermost surface of ground pad 32 exposed at the backside of component 24. As a further possibility, integrated heat dissipation post 22 may be fabricated as a discrete piece, proximal end portion 64 may abut ground pad 32, and a bond layer may be formed around the periphery of the post-pad interface to join post 22 to pad 32.

As indicated above, integrated heat dissipation post 22 is joined to microelectronic component 24 by at least one thermally-conductive proximal bond layer 62; the qualifier "proximal" denoting that bond layer 62 is located adjacent and, perhaps, directly contacts proximal end portion 64 of heat dissipation post 22. In the example of FIG. 1, proximal bond layer 62 is located beneath and contacts a central region of ground pad 32, as taken along the centerline of post 22. Heat dissipation post 22 is thus mechanically, thermally, and perhaps electrically coupled to ground pad 32 through proximal bond layer 62. Thermally-conductive proximal bond layer 62 can be composed of various bonding materials having relatively high thermal conductivies. When heat dissipation post 22 is utilized for electrical interconnection purposes, thermally-conductive proximal bond layer 62 is also usefully composed of a material possessing a relatively high electrical conductivity. Suitable materials include, but are not limited to, metal-filled epoxies (including B-stage epoxies), die attach materials, solder materials, and sintered metallic materials. Sintered metallic materials, in particular, are well-suited for imparting proximal bond layer 62 with a relatively high thermal conductivity, electrical conductivity, and bond strength. Further, proximal bond layer 62 can be formed from such sintered materials utilizing a relatively straightforward, repeatable, low temperature sintering process, as described more fully below in conjunction with FIGS. 2-3.

When formed as a sintered bond layer, thermally-conductive proximal bond layer 62 may be predominately composed of or consist essentially of Cu, Ag, and/or Au, by wt %. In such embodiments, thermally-conductive proximal bond layer 62 may or may not contain organic materials. For example, in certain implementations, thermally-conductive proximal bond layer 62 may be essentially free of organic materials; the term "essentially free," as appearing herein, defined as containing less than 1 wt % of organic materials. In other implementations, thermally-conductive proximal bond layer 62 may contain organic materials or fillers, such as an epoxy, enhancing the strength or other properties proximal bond layer 62. When predominately or exclusively composed of such sintered metallic materials, thermally-conductive proximal bond layer 62 may have a thermal conductivity exceeding about 30 W/mK, preferably exceeding about 50 W/mK, and more preferably exceeding about 70 W/mK. The porosity of proximal bond layer 62 can also be controlled and, in certain embodiments, may be less than 1% and, perhaps, less than 0.5% by volume. Again, further description of proximal bond layer 62, when formed as such a sintered bond layer, is set-forth below in connection with FIGS. 2-3. First, however, additional description of the various other structural features contained in exemplary microelectronic system 20 is provided.

As indicated above, socket cavity 36 can be formed as a through hole extending fully through substrate 26 or, instead, as a blind tunnel or bore penetrating substrate frontside 38, but terminating at a desired depth within substrate 26. In the example of FIG. 1, specifically, socket cavity 36 is formed as a blind tunnel, which terminates within substrate 26 at a lower endwall or cavity floor 67. Cavity floor 67 is defined by an inner surface region of backside metal layer 58 exposed by socket cavity 36. In other embodiments, socket cavity 36 may be formed to have a shallower depth and, thus, may terminates at a different layer within substrate 26, which then defines cavity floor 67. Alternatively, socket cavity 36 may be initially formed as a fully penetrating cavity and the lower portion of cavity 36 may be plugged by installation of another structure, which then defines the cavity floor. An example of such a configuration is further described below in conjunction with FIGS. 9 and 10.

Distal end portion 66 of integrated heat dissipation post 22 is contained within socket cavity 36 when formed as a blind tunnel or bore. Heat dissipation post 22 may be dimensioned such that (and, as corollary, the respective thicknesses of below-described layers 62, 72, 74, 76, 78, 82 may be controlled such that) distal end portion 66 is separated or offset from cavity floor 67 by an axial gap or clearance, as taken along the centerline of heat dissipation post 22 (parallel to the Y-axis of coordinate legend 60). In such embodiments, and as shown in FIG. 1, a thermally-conductive distal bond layer 68 may be formed within socket cavity 36 to contact cavity floor 67, distal end portion 66 of heat dissipation post 22, and the inner cavity sidewall defining the lower portion of cavity 36. In so doing, distal bond layer 68 fills or substantially fills the axial gap or clearance provided between distal end portion 66 of heat dissipation post 22 and cavity floor 67. Distal bond layer 68 may also contact and extend around a periphery of distal end portion 66, as shown, to partially occupy the peripheral between heat dissipation post 22 and the inner cavity sidewalls defining socket cavity 36. Distal bond layer 68 thus mechanically, thermally, and possibly electrically couples heat dissipation post 22 to backside metal layer 58. In alternative embodiments, heat dissipation post 22 may be lengthened such that distal end portion 66 of directly contacts or abuts cavity floor 67. In this latter case, microelectronic system 20 may not contain a thermally-conductive distal bond layer 68; or distal bond layer 68 may be provided and extend exclusively around the periphery of distal end portion 66.

As is thermally-conductive proximal bond layer 62, thermally-conductive distal bond layer 68 is usefully formed from a bonding material having a relatively high thermal conductivity and, when so desired, a relatively high electrical conductivity. Suitable bonding materials include those listed above, such as solder materials, thermally-conductive die attach materials, metal-filled epoxies, and sintered metallic materials. In one embodiment, thermally-conductive distal bond layer 68 is formed from a solder material, which can be reflowed in conjunction with reflow of solder contacts utilized to bond microelectronic component 24 to substrate 26, as discussed more fully below in conjunction with FIGS. 4-5. Regardless of the particular bonding material from which distal bond layer 68 is composed, thermally-conductive distal bond layer 68 may help secure heat dissipation post 22 in its desired position, while further ensuring that a robust thermal coupling is provided between distal end portion 66 of heat dissipation post 22 and backside metal layer 58. Finally, as labeled in FIG. 1, peripheral gap regions 70 formed between an intermediate portion of heat dissipation post 22 and the interior sidewalls of socket cavity 36 may be left unfilled as gas-containing voids. Alternatively, peripheral gap regions 70 may be filled with one or more conductive bond materials in alternative embodiments by, for example, increasing the volume of thermally-conductive distal bond layer 68 applied into socket cavity 36 during the below-described fabrication process.

When viewed in three dimensions, integrated heat dissipation post 22 may have a relatively simple column-, rod-, or block-shaped form factor. For example, and as shown more clearly in FIGS. 2-3 (described below), heat dissipation post 22 may have a rod-like geometry and a circular, ovular, or polygonal (e.g., rectangular) cross-sectional shape, as taking along a section plane through the centerline of post 22; that is, along a plane parallel to the X-Z plane of coordinate legend 60. When heat dissipation post 22 is imparted with a circular cross-sectional shape, this may ease rotational alignment of heat dissipation post 22 relative to socket cavity 36, as taken about the post centerline. Moreover, in embodiments wherein post 22 is formed to have a constant cross-section along its length, heat dissipation post 22 can be fabricated in a cost-effective manner by, for example, singulation of an extruded metallic rod having the desired cross-sectional shape and dimensions. Still, in other instances, integrated heat dissipation post 22 may be imparted with a more complex geometry and, perhaps, may possess a T-shaped, U-shaped, or pyramidal profile, as viewed along the Y-X plane and/or Y-Z plane of coordinate legend 60. The geometry of heat dissipation post 22 may or may not conform substantially with that of socket cavity 36; although the planform dimensions of post 22 will be less than those of socket cavity 36 to allow post insertion into cavity 36. To provide a relatively robust thermal conduction path through substrate 26, heat dissipation post 22 is usefully dimensioned to occupy a volumetric majority of cavity 36, as previously noted; and, perhaps, to possess a three dimensional geometry providing a relatively small peripheral gap between an outer periphery of heat dissipation post 22 and the inner periphery of socket cavity 36 when post 22 is properly positioned within cavity 36.

Integrated heat dissipation post 22 can be realized as any prefabricated structure or part having a relatively high thermal conductivity, which exceeds that of substrate 26 taken through its thickness; that is, taken from substrate frontside 38 to substrate backside 40 along the Y-axis of coordinate legend 60. The thermal conductivity of integrated heat dissipation post 22 may also be substantially equivalent to or exceed that of thermally-conductive proximal bond layer 62 in certain embodiments. In one group of embodiments, integrated heat dissipation post 22 is realized as a monolithic body of material. In such embodiments, heat dissipation post 22 can be composed of a metallic material, a non-metallic material, or a composite material having a relatively high thermal conductivity. Suitable metallic materials include Al, Cu, and nickel (Ni), as well as alloys thereof. Suitable non-metallic materials and composites include diamond polycarbonate materials, diamond-metal composites (e.g., diamond Au, diamond Ag, and diamond Cu), pyrolytic graphite, and materials containing allotropes of carbon, such as graphene and carbon nanotube-filled materials. In other implementations, integrated heat dissipation post 22 can possess a non-monolithic constructive, such as a layered or composite construction. For example, in this latter case, heat dissipation post 22 can be fabricated to contain one or more metal (e.g., Cu) layers interspersed with other metallic layers, such as molybdenum (Mo) or a copper-molybdenum (Cu—Mo) alloy layers, having a CTE less than that of the Cu layer(s). In this manner, the effective CTE of heat dissipation post 22 can be more closely matched to substrate 26, heat-generating microelectronic component 24, and/or another portion of microelectronic system 20.

Heat dissipation post 22 may assume still other forms in additional embodiments. For example, as a further possibility, heat dissipation post 22 may assume the form of a heat pipe; that is, a hermetically-enclosed tube containing a working fluid (e.g., an ammonia, alcohol, and/or water mixture), which transfers heat from one end of the tube (e.g., proximal end portion 64) to an opposing end of the tube (e.g., distal end portion 66) in a thermally-efficient manner. The fluid within the heat pipe undergoes a phase change and, specifically, may absorb latent heat and vaporize at the hot interface of the heat pipe (e.g., a first closed end); the vapor phase flows to the relatively cool interface of the heat pipe (e.g., an opposing closed end) and condenses to release latent heat; and the liquid phase then returns to the hot interface to complete the heat transfer circuit. When assuming the form of a heat pipe, heat dissipation post 22 may contain or be internally lined with a wicking material, which promotes flow of the liquid phase from the cold interface to the hot interface via capillary action. Although by no means limited to a particular shape or material, the shell of the heat pipe may assume the form of an elongated, blind tube fabricated from a thermally-conductive metal or alloy, such as Cu or Al. Generally, heat dissipation post 22 is usefully implemented as a heat pipe in embodiments in which integrated heat dissipation post 22 is relatively lengthy, as may be the case when substrate 26 is relatively thick and/or integrated heat dissipation post 22 extends beyond substrate backside 40 to protrude from substrate 26 by some distance.

Heat-generating microelectronic component 24 can be attached to substrate 26 in various different manners, including through the usage of die attach materials and sintered materials of the type described herein. In the illustrated embodiment of FIG. 1, solder bodies or contacts 72, 74, 76, 78 are utilized to attach terminals of heat-generating microelectronic component 24 to corresponding bond pads or points-of-contact present on substrate frontside 38. Solder contacts 72, 78, specifically, provide mechanical and electrical connections between bond pads provided on substrate 26 and I/O terminals 34 of component 24. Comparatively, solder contacts 74, 76 are bonded to an outer peripheral portion of ground pad 32. Solder contacts 74, 76 may also include encroachment regions 80, which extend or encroach into socket cavity 36 and contact an outer peripheral portion of proximal end portion 64 of heat dissipation post 22. When viewed in three dimensions, solder contacts 74, 76 may join to form a complete ring around the proximal end of integrated heat dissipation post 22, as taken about the centerline of heat dissipation post 22 (again, parallel to the Y-axis of coordinate legend 60). Alternatively, solder contacts 74, 76 may be discrete or discontinuous bodies of solder formed at selected locations around the proximal end of heat dissipation post 22. Central ground pad 32 of microelectronic device 24 is thus secured to substrate 26 by both solder contacts 74, 76; as well as by thermally-conductive proximal bond layer 62, which may be composed of a sintered material or another aforementioned material having a higher thermal conductivity than do solder contacts 74, 76. A patterned solder mask layer 82 is further formed over substrate frontside 38 between microelectronic component 24 and substrate 26. Solder mask layer 82 is patterned to provide the desired electrical isolation between solder contacts 72, 74, 76, 78.

Solder contacts 74, 76 may define an annular or ring-shaped containment structure or shell 74, 76, hereafter referred to as "bond layer containment ring 74, 76." Bond layer containment ring 74, 76 generally circumscribes the mouth or opening of socket cavity 36, which penetrates frontside 38 of substrate 26. In embodiments, bond layer containment ring 74, 76 may prevent or physically deter undesired migration of thermally-conductive proximal bond layer 62 in a laterally-outward direction toward the outer periphery of heat-generating microelectronic component 24 and solder contacts 72, 78; that is, along the X- and/or Z-axis identified by coordinate legend 60 in FIG. 1. Bond layer containment ring 74, 76 is thus beneficially provided when thermally-conductive proximal bond layer 62 is composed of a material prone to gradual migration, such as certain sintered (e.g., Ag) materials of the type described below. In other implementations of microelectronic system 20, bond layer containment ring 74, 76 can be formed in another manner, such as by depositing a ring of epoxy ahead of device attachment or by fabricating microelectronic component 24 to include an annular projection serving as bond layer containment ring 74, 76. In yet further embodiments, microelectronic system 20 may lack such a bond layer containment ring.

A thermal stack juncture region is formed between microelectronic component 24, integrated heat dissipation post 22, and intervening proximal bond layer 62. This juncture or region is of particular import in promoting heat flow from microelectronic component 24 and into heat dissipation post 22. In embodiments in which bond layer 62 is formed from a high K material (that is, a material having a thermal conductivity exceeding 50 W/mK), such as certain sintered metallic materials of the type described herein, thermally-conductive proximal bond layer 62 supports efficient conductive heat transfer from heat-generating microelectronic component 24 and into proximal end portion 64 of heat dissipation post 22. Thus, in the present example, excess heat is conductively removed in an efficient manner from the central portion of ground pad 32, which has a propensity to reach elevated temperatures more quickly than does the outer peripheral portion of ground pad 32 to which solder contacts 74, 76 are bonded. Moreover, thermally-conductive proximal bond layer 62 may have a temperature tolerance that approaches or exceeds 200° C. in certain instances, such as when thermally-conductive proximal bond layer 62 is composed of a Ag, Cu, or Au-based sintered material. Such temperatures tolerances well-exceed those of conventional solder materials, which tend to rapidly fatigue and fail at temperatures approaching or exceeding approximately 125° C. Thus, in embodiments, integrated heat dissipation post 22 and proximal bond layer 62 may cooperate or combine to enables operation of heat-generating microelectronic component 24 at higher power levels and/or frequencies with reduced peak temperatures within the thermal stack and improved preservation of solder joint integrity.

As previously noted, integrated heat dissipation post 22 can be leveraged to electrically interconnect one or more terminals of microelectronic component 24 to other electrically-active features or devices contained within microelectronic system 20. This may be beneficial when microelectronic component 24 assumes the form of a PAM package or another RF device, which is desirably grounded in a relatively robust and direct manner. In this regard, the combination of heat dissipation post 22 and solder contacts 74, 76 may provide an electrically-conductive path from ground pad 32 to an internal metal level or wiring layer within substrate 26 utilized for electrical grounding purposes. In embodiments, the internal wiring layer closest microelectronic component 24 (i.e., wiring layer 44) as taken along an axis orthogonal to substrate frontside 38 (corresponding to the Y-axis of coordinate legend 60) is realized as an RF grounding layer. In such embodiments, a high electrical conductivity, large volume, and direct electrical path is thus provided from ground pad 32 to RF ground layer 44 through proximal bond layer 62, integrated heat dissipation post 22, and solder contact encroachment regions 80. A robust RF grounding scheme is therefore provided within microelectronic system 20, while enabling system fabrication in a relatively straightforward and cost-effective manner; e.g., without requiring the formation of additional vias or a via farm between a metal slug or coin and the internal grounding layer. An exemplary process for fabricating microelectronic system 20 will now be described in conjunction with FIGS. 2-5.

Examples of Microelectronic System Fabrication Methods

An exemplary fabrication process for manufacturing microelectronic system 20 will now be described in conjunction with FIGS. 2-5. The below-described process steps are provided by way of non-limiting example only. In further implementations, the below-described process steps may be performed in alternative sequences, certain steps may be omitted, and various other process steps can be introduced into the fabrication process. Further, if desired, multiple microelectronic systems similar or identical to microelectronic system 20 may be fabricated in parallel with system 20 by performing the below-described process steps globally across a relatively large substrate or panel, which is subsequently singulated to yield a plurality of discrete units. For the purposes of the following description, a prime symbol (') will be appended to those reference numerals designating structural elements or items in a non-completed or transitional state during the fabricating process. For example, in FIGS. 4 and 5, microelectronic system 20 is shown in a partially completed state and thus identified utilizing reference numeral "20'."

Figure 2:
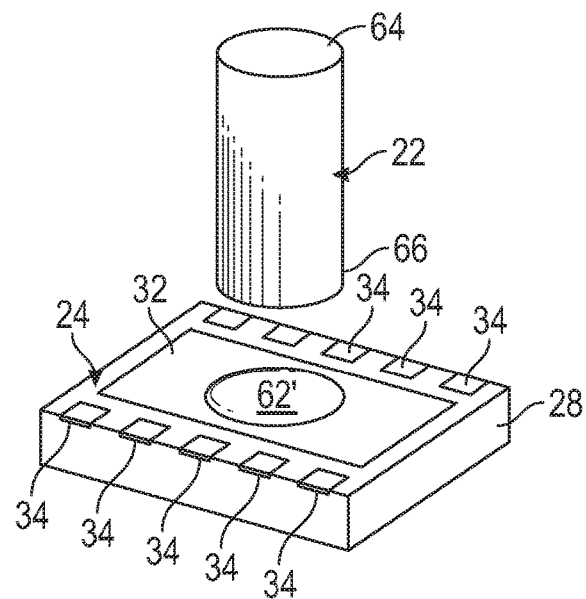
FIGS. 2-5 depict the microelectronic system shown in FIG. 1 at various stages of fabrication, as produced in an accordance an exemplary microelectronic system fabrication process.

With initial reference to FIG. 2, the microelectronic system fabrication process commences with attachment of integrated heat dissipation post 22 to microelectronic component 24. Heat dissipation post 22 can be attached to microelectronic component 24 utilizing any of a number of different attachment techniques and thermally-conductive bonding materials. As previously discussed, a non-exhaustive list of suitable thermally-conductive bonding materials includes thermally-conductive die attach materials, metal-filled epoxies, solder materials, and metallic sintered materials of the type described herein. In various embodiments, a precursor material is first deposited or applied at the appropriate location and then converted to thermally-conductive proximal bond layer 62 utilizing a curing process. An example of such a body of precursor material 62' is shown in FIG. 2. As can be seen, a body of precursor material 62' is dispensed or otherwise applied onto the outer surface region of ground pad 32 to which heat dissipation post 22 is desirably bonded. Bond layer precursor material 62' can be applied onto ground pad 32 utilizing either a wet state or dry state application technique. In other embodiments, bond layer precursor material 62' may be applied in a wet state to selected surfaces of heat dissipation post 22. Bond layer precursor material 62' may have various different formulations, which can undergo subsequent processing to yield proximal bond layer 62 shown in FIG. 1. As described throughout this document, certain performance benefits may be achieved by forming thermally-conductive proximal bond layer 62 as a sintered metal layer. Accordingly, in this case, bond layer precursor material 62' may be formulated as a metal particle-containing precursor material, which can be subsequently transformed into bond layer 62 by sintering.

Wet state application techniques suitable for application of bond layer precursor material 62' include, but are not limited to, screen or stencil printing, doctor blading, spraying, and fine needle dispense techniques. When a wet state application technique is employed to apply bond layer precursor material 62', a flowable or wet state bond layer precursor material is initially obtained by, for example, independent production or purchase from a third party supplier. In addition to metal particles of the type described below, the wet state bond layer precursor material (precursor material 62' shown in FIG. 2) may contain other ingredients (e.g., a solvent and/or surfactant) to facilitate wet set application, to adjust the viscosity of the precursor material, to prevent premature agglomeration of the metal particles, or to serve other purposes. In one embodiment, the wet state bond layer precursor material contains metal particles in combination with a binder (e.g., an epoxy), a dispersant, and a thinner or liquid carrier. The volume of solvent or liquid carrier contained within the bond layer precursor material can be adjusted to tailor the viscosity of the precursor material to the selected wet state application technique. For example, in an implementation in which the precursor material is desirably applied by screen printing or doctor blading, the bond layer precursor material may contain sufficient liquid to create a paste, slurry, or paint. After application of the wet state coating material, a drying process can be carried-out to remove excess liquid from the bond layer precursor material, if so desired.

In further embodiments, bond layer precursor material 62' can be applied utilizing a dry state application technique. In this case, precursor material 62' can be applied utilizing a film transfer process or other dry state application technique can be utilized to apply the precursor material onto selected surfaces of heat dissipation post 22 or ground pad 32. Regardless of whether precursor material 62' is applied in a wet or dry state, the metal particles dispersed within bond layer precursor material 62' can have any composition, shape, and size enabling the particles to form a substantially coherent adhesive layer pursuant to the below-described sintering process. In one embodiment, bond layer precursor material 62' contains Au, Ag, or Cu particles, or a mixture thereof. In another embodiment, the metal particles contained within precursor material 62' consist essentially of Ag or Cu particles. The metal particles contained within precursor material 62' may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the microelectronic system fabrication process.

The metal particles contained within bond layer precursor material 62' can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns (μm) and about 10 nanometers (nm) in an embodiment. In other embodiments, the metal particles may have average maximum dimensions greater than or less than the aforementioned range. In certain implementations, a mixture of metal particles having average maximum dimensions in both the nanometer and micron range may be present within the precursor material. In other implementations, only nanoparticles (that is, particles having average maximum dimensions between 1 and 1000 nm) may be contained within bond layer precursor material 62'. As a specific, albeit non-limiting example, precursor material 62' may contain at least one of Ag, Au, or Cu nanoparticles or micron-sized particles in an embodiment, with Ag or Cu nanoparticles preferred.

After application of bond layer precursor material 62', heat dissipation post 22 and microelectronic component 24 are brought into contact and a sintering process is carried-out. As appearing herein, the sintering process is considered a type of "curing," as are other techniques (including solder reflow) involving the application of heat, pressure, and/or particular wavelengths of light utilized to process a material into its final form or composition. In the case of the illustrated example, specifically, a low temperature sintering process may be performed to transform precursor material 62' into thermally-conductive proximal bond layer 62. Such a "low temperature" sintering process may be performed during which the peak processing temperatures are maintained below a peak processing temperature $T_{MAX}$. $T_{MAX}$ is preferably less than 300° C. in embodiments. In many cases, $T_{MAX}$ will also be significantly less than the melt point of the metal particles contained within precursor material 62' and, perhaps, less than one half the melt point of the particles considered on an absolute temperature scale (in Kelvin). In still further embodiments, $T_{MAX}$ may vary during the sintering process, providing that $T_{MAX}$ (in conjunction with the other process parameters) is sufficient to induce sintering of the metal particles without liquefaction thereof.

The above-described, low temperature sintering process can be carried-out under any process conditions suitable for transforming precursor material 62' into thermally-conductive proximal bond layer 62. The sintering process may be performed with or without pressure, with or without heating (although some degree of elevated heat will typically be applied), and in any suitable atmosphere (e.g., open air or in the presence of an inert gas, such as nitrogen). A multistage heating schedule can be employed, if desired. Additionally, in at least some implementations, a controlled convergent pressure may be applied across heat dissipation post 22 and microelectronic component 24 during the sintering process. When applied, the convergent pressure can be delivered as a substantially constant force to distal end portion 66 of heat dissipation post 22 or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final layer thickness of thermally-conductive proximal bond layer 62, the desired porosity of layers 62, 68, and the composition of bond layer precursor material 62'.

The sinter bond process thus advantageously forms low stress, mechanically-robust, solid state metallurgical diffusion bonds at the bond joint interfaces, particularly at the joinder interface between ground pad 32 of microelectronic component 24 and proximal end portion 64 of heat dissipation post 22. When produced utilizing the above-described metal sintering process, proximal bond layer 62 may be predominately composed of one or more sintered metals. Again, the sintered bond layer may or may not contain organic materials. In one embodiment, thermally-conductive proximal bond layer 62 may consist essentially of one or more metals (e.g., essentially pure Cu or essentially pure Ag) and are essentially free of organic material; that is, contain less than 1 wt % of organic materials. In other embodiments, bond layer 62 may contain resin or other organic fillers. For example, in another implementation, bond layer 62 may contain organic materials that increase pliability, such as an epoxy, to reduce the likelihood of crack formation and propagation across thermal cycles. Depending upon the desired final composition of bond layer 62, the parameters of the sintering process may be controlled to decompose organic materials from bond layer precursor material 62', in whole or in part. Additionally, bond layer 62 may be produced to have a desired porosity, which may range from 0% to 30% by volume in an embodiment. In another embodiment, the sintered bond layer may be formed to have a porosity of less than 1% and, perhaps, less than 0.5% by volume. Finally, the thickness of thermally-conductive proximal bond layer 62 (i.e., the dimension between heat dissipation post 22 and ground pad 32) will vary amongst embodiments, but may range between about 5 μm and about 100 μm and, preferably, between about 15 μm and about 146 μm in an exemplary and non-limiting embodiment.

Figure 3:
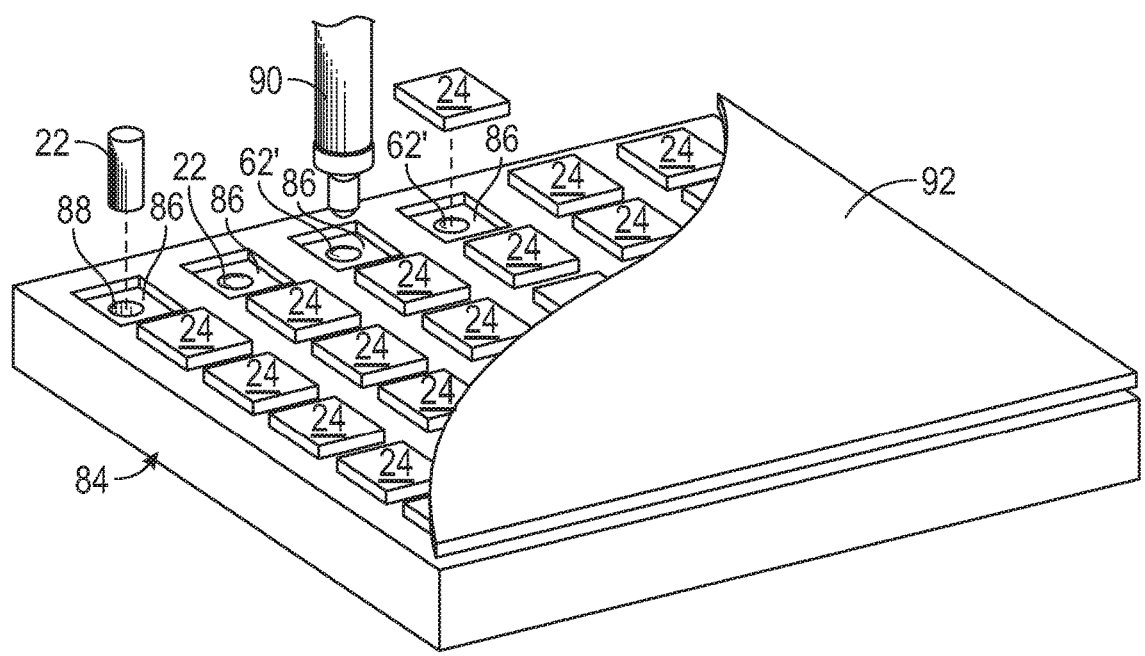

Process efficiency may be improved by concurrently attaching a plurality of heat dissipations posts, which are similar or identical to integrated heat dissipation post 22, to a corresponding plurality of microelectronic component 24, which are similar or identical to microelectronic component 24. One approach for batch-type attachment of a plurality of heat dissipation posts 22 to a corresponding plurality of microelectronic components 24 is illustrated in FIG. 3. In this example, a specialized fixture 84 is provided and fabricated from a suitable material, such as a machinable ceramic. A plurality of recesses 86 is formed across the upper surface of fixture 84 and sized to receive a plurality of microelectronic components therein; the illustrated microelectronic components each designated with reference numeral "24" as such components may be similar or substantially identical to microelectronic component 24 shown in FIGS. 1-2. Bores 88 are further provided in fixture 84 at locations below recesses 86; only one of which can be seen in FIG. 3. During processing, a pick-and-place tool is utilized to position heat dissipation posts 22 in bores 88 such that proximal end portions 64 of heat dissipation posts 22 are exposed along the floors of fixture recesses 86. A computer-controlled dispense tool 90 then deposits bodies of precursor material 62' at desired locations onto proximal end portions 64 of posts 22. Microelectronic components 24 are subsequently moved into their desired positions utilizing, for example, a pick-and-place tool; and the low temperature sintering process is carried-out. If convergent pressure is desirably applied across the post-pad interfaces and precursor material bodies 62' during the sintering process, a pressure plate 92 (partially shown) may be further positioned over the array of microelectronic components 24 and utilized to concurrently apply a controlled, uniform pressure to precursor material bodies 62' through components 24 in the manner previously described.

Figure 4:
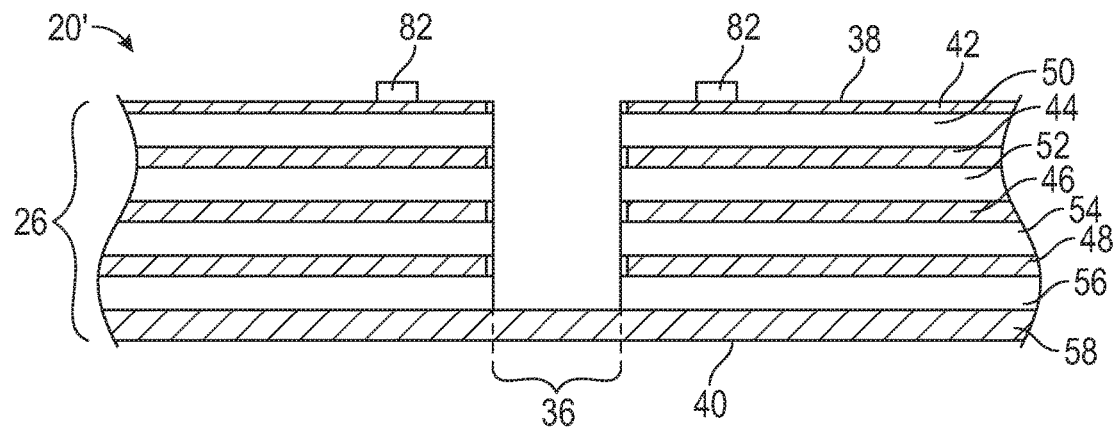

Turning to FIG. 4, substrate 26 is purchased or otherwise obtained prior to, after, or concurrent with attachment of heat dissipation post 22 to heat-generating microelectronic component 24. As appearing herein, the term "obtain" encompasses both independent fabrication of substrate 26, as well as acquisition from a third party supplier. Accordingly, substrate 26 can be obtained by independent fabrication to commence the fabrication process, but will more commonly be purchased from a vendor, such as a PCB manufacturer. When so purchased, substrate 26 may be further processed to create socket cavity 36 if not already present. However, more typically, socket cavity 36 will be formed in substrate 26, with any desired plating of the inner cavity sidewalls applied. After obtaining substrate 26, patterned solder mask layer 82 is formed on substrate frontside 38. Patterned solder mask layer 82 may be formed by first depositing a blank solder mask layer over frontside and, specifically, around a perimeter of the opening of socket cavity 36 penetrating substrate frontside 38. The blank solder mask layer is then patterned utilizing, for example, a lithographic patterning process flow to create a number of solder mask openings in the solder mask layer and yield patterned solder mask layer 82 shown in FIG. 4.

Figure 5:
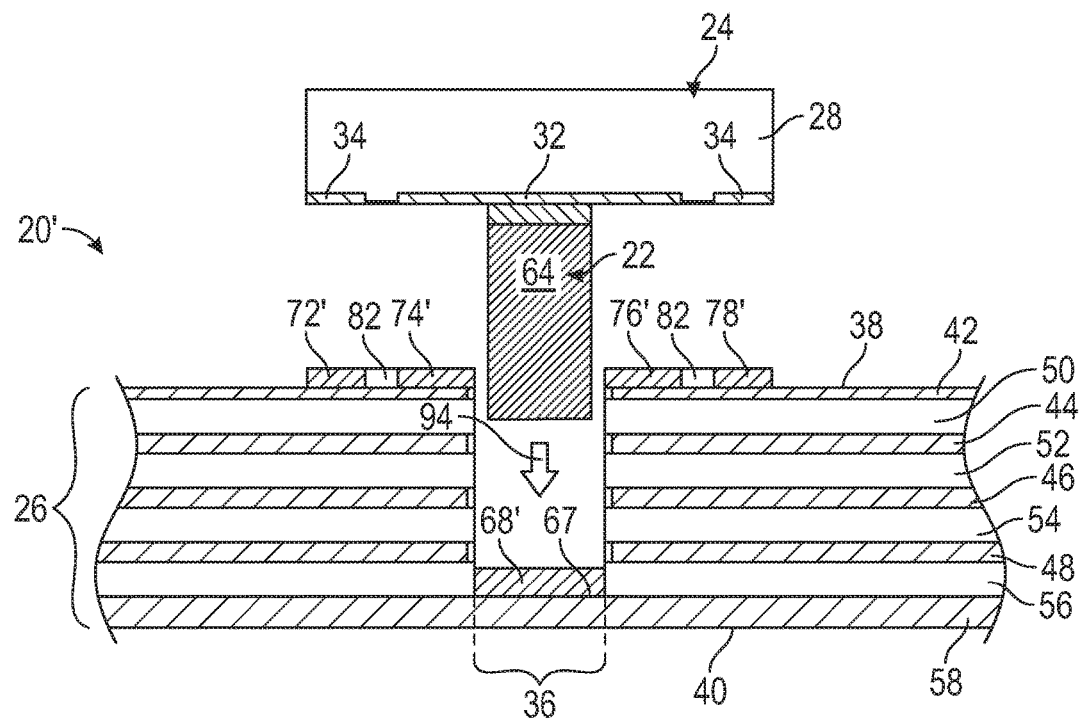

Advancing to FIG. 5, microelectronic component 24 and integrated heat dissipation post 22 are next attached to substrate 26. In the illustrated example in which heat-generating microelectronic component 24 is attached to substrate 26 utilizing a solder material, discrete bodies or globules of solder 72', 74', 76', 78' may be screen printed or otherwise deposited onto frontside 38 of substrate 26. After deposition of the solder bodies, heat-generating microelectronic component 24 is placed its desired position utilizing, for example, a pick-and-place tool. When so positioned, heat-generating microelectronic component 24 is bought into contact with deposited solder bodies 72', 74', 76', 78' and patterned solder mask layer 82 and is thus considered to be "seated" on substrate 26. Heat treatment is then carried-out to reflow solder bodies 72', 74', 76', 78' into solder contacts 72, 74, 76, 78. The desired solder joints are thus created between solder contacts 72, 74, 76, 78; terminals 32, 34 of microelectronic component 24; and the corresponding terminals located in metal layer 38 of substrate 26. Furthermore, the outer periphery of ground pad 32 is bonded to solder contacts 74, 76, while a central portion of ground pad 32 is bonded to heat dissipation post 22 by thermally-conductive proximal bond layer 62.

In the above-described manner, microelectronic component 24 is attached to substrate 26 at a location overlying socket cavity 36 and bond layer containment ring 74, 76, as taken along an axis orthogonal to substrate frontside 38 or the post centerline (parallel to the Y-axis of coordinate legend 60 in FIG. 1). When so positioned, microelectronic component 24 may fully cover or enclose socket cavity 36 as observed from frontside 38 of substrate 26. Further, when microelectronic component 24 is seated on substrate 26, heat dissipation post 22 is received within into socket cavity 36, as indicated in FIG. 5 by arrow 94. Thus, during component position, microelectronic component 24 may be moved into a desired horizontal position (that is, in a desired position in the X-Z plane of coordinate legend 60 shown in FIG. 1) at a level above substrate 26, and then lowered into desired vertical position on substrate 26 such that integrated heat dissipation post 22 inserts or engages into socket cavity 36 along the centerline of heat dissipation post 22. In embodiments in which distal bond layer 68 is formed from a wet-state precursor material dispensed into socket cavity 36 or a powder packing loading into cavity 36 prior to seating of microelectronic component 24, distal end portion 66 of heat dissipation post 22 may be pressed into the puddle or body of wet-state precursor material 68' or powder packing during component positioning such that the wet-state precursor material or powder flows over and around distal end portion 66 ahead of the below-described heat treatment process.

Thermally-conductive distal bond layer 68 is usefully formed in conjunction with solder contacts 72, 74, 76, 78 for enhanced process efficiency. In this regard, a body of solder paste 68' may be applied into socket cavity 36 prior to positioning of microelectronic component 24 and heat dissipation post 22 over substrate 26; solder paste 68' considered a type of bond layer precursor material for the purposes of the present document. As indicated in FIG. 5, solder paste 68' may be dispensed in sufficient volume to allow distal end portion 66 to press into the solder paste when microelectronic component 24 is moved into its desired position. Alternatively, the solder precursor material can be applied as a film, a loose powder packing, or compressed power preform applied into socket cavity 36 and onto cavity floor 67 defined by backside metal layer 58. In yet other embodiments, such solder material can be applied onto distal end portion 66 of heat dissipation post 22 prior to insertion into socket cavity 36 in conjunction with placement of microelectronic component 24 over substrate 26. A common solder reflow process may then be carried-out to transform solder paste body 68' into thermally-conductive distal bond layer 68, along with transformation of solder bodies 72', 74', 76', 78' into reflowed solder contacts 72, 74, 76, 78. Any desired additional steps may then be performed following solder reflow to complete the fabrication process and yield completed microelectronic system 20 shown in FIG. 1.

While formed from a solder material in the above-described exemplary embodiment, thermally-conductive distal bond layer 68 can be formed from other thermally-conductive materials in alternative embodiments. Such materials include metal filled-epoxies and die attach materials, which may be adhesively-activated or cured utilizing any combination of heating, pressure, Ultraviolet (UV) light, or the like. As a further possibility, thermally-conductive distal bond layer 68 can be formed from a sintered metallic material of the type described above in conjunction with thermally-conductive proximal bond layer 62 in certain embodiments. In such embodiments, a low temperature sintering process can be carried-out to transform a bond layer precursor material into thermally-conductive distal bond layer 68, as previously discussed in detail. Thus, in such embodiments, the foregoing description of proximal bond layer 62 may be equally applicable to the composition and formation of distal bond layer 68. In yet further implementations, thermally-conductive distal bond layer 68 can be formed after attachment of microelectronic component 24 to substrate 26. This may be the case when, for example, socket cavity 36 penetrates fully through substrate 26 and distal end portion 66 remains accessible from the backside of substrate 26 following component attachment. For example, in such embodiments, peripheral regions 70 can also be filled with a selected (e.g., thermally-conductive) material utilizing a backfill process; e.g., system 20 may be inverted, and then solder may be infiltrated into this gap by capillary action and/or utilizing a solder wick.

There has thus been described an exemplary embodiment of a microelectronic system, which can be fabricated utilizing a relatively straightforward, repeatable, low cost manufacturing process to yield an integrated heat dissipation post enhancing the thermal performance characteristics of the resultant system. In alternative embodiments of the microelectronic system can be produced to contain other types of heat-generating microelectronic components, such as bare die and/or microelectronic modules having disparate form factors as compared to that shown in FIG. 1. For example, in yet further embodiments, the microelectronic system may contain a microelectronic module having a different form factor, such as a leaded form factor. In this regard, embodiments of the microelectronic system can incorporate any number and type of microelectronic components and packages including, but not limited to, PAM packages, quad flat no-lead packages, and gull wing packages implemented utilizing an air cavity or over-molded package body, to list but a few examples. Additionally or alternatively, in further embodiments, the heat dissipation post may be integrally formed with a structural feature or surface of the heat-generating microelectronic component, such as a ground pad included in the component when assuming the form of a microelectronic package, such as a PAM package. To help further emphasize such points, an additional exemplary embodiment of a microelectronic system including an integrated heat dissipation post will now be described in conjunction with FIG. 6.

Figure 6:
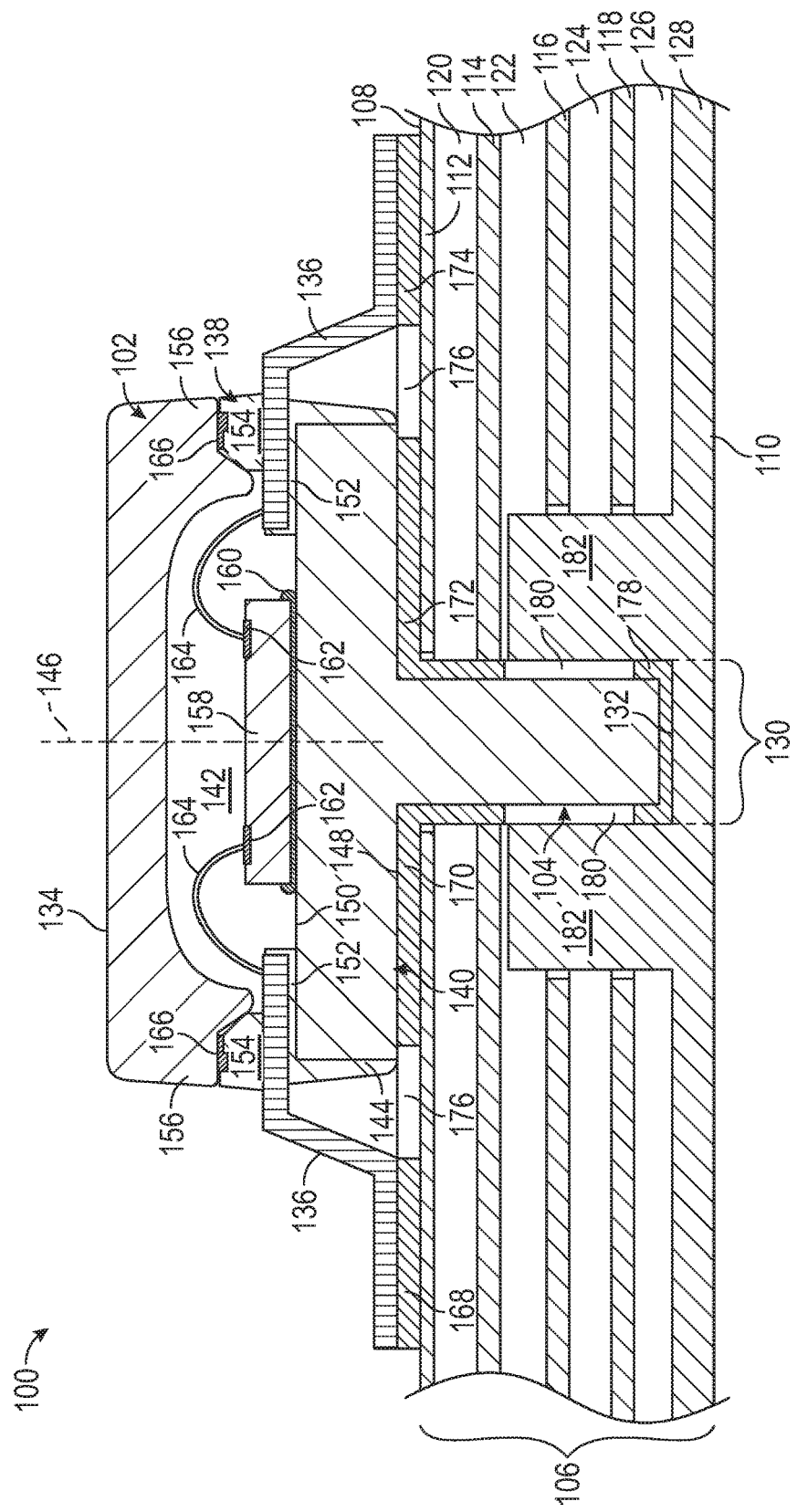
FIG. 6 is cross-sectional view of a microelectronic system including a heat-generating microelectronic component and an integrated heat dissipation post, which is integrally formed with a thermal flange or ground pad contained in the microelectronic component, as illustrated in accordance with an exemplary embodiment of the present disclosure.

Alternative Examples of Microelectronic Systems Containing Components Having Integrated Heat Dissipation Post FIG. 6 is a cross-sectional view of a microelectronic system 100 including a microelectronic component 102 having an integrated heat dissipation post 104, as illustrated in according with a further exemplary embodiment of the present disclosure. In many respects, microelectronic system 100 is similar to microelectronic system 20 described above in conjunction with FIGS. 1-5. For example, as does microelectronic system 20, microelectronic system 100 includes a base supportive or structure substrate 106, such as a multi-layer PCB, having a frontside 108 and an opposing backside 110. Heat-generating microelectronic component 102 is mounted to substrate frontside 108, whether by attachment to the uppermost surface of substrate 106 (as shown) or by attachment to a recess or cavity formed in substrate 106. Once again, a frontside metallization layer 112 is provided on substrate 106 and defines pads, traces, and other such electrically-conductive routing features to which microelectronic component 102 is electrically interconnected. Substrate 106 further contains a number of internal metal levels or internal wiring layers 114, 116, 118, which are interspersed with dielectric layers 120, 122, 124, 126. Wiring layer 114, which is located closest microelectronic component 102, may serve as ground layer in an embodiment. A backside metal layer 128, such as a relatively thick Cu layer, is further formed on substrate 106. Finally, a socket cavity 130 extends from substrate frontside 108 toward substrate backside 110 and terminates within substrate 106 at a cavity floor 132.

As was the case with microelectronic component 24 shown in FIGS. 1-3 and 5, heat-generating microelectronic component 102 may be realized as a PAM module or other microelectronic package. In the exemplary embodiment shown in FIG. 6, in particular, microelectronic component 102 assumes the form of a leaded ACM package and is consequently referred to below as "leaded ACM package 102." Progressing from top to bottom in FIG. 6, leaded ACM package 102 includes a lid or cover piece 134, a plurality of package leads 136, a molded package body 138, and a ground pad or base flange 140. Additionally, leaded ACM package 102 contains an air cavity 142, which is bounded and defined by cover piece 134, molded package body 138, base flange 140, and, to a lesser extent, package leads 136. Air cavity 142 may contain air, another inert gas, or a gas mixture, and may or may not be partially evacuated or pressurized relative to the ambient environment. The hermicity of air cavity 142 will vary amongst embodiments, although ACM package 102 is preferably produced such that relatively little, if any leakage occurs between cavity 142 and the ambient environment.

Molded package body 138 can be imparted with different geometries and structural features. In the illustrated example, molded package body 138 is formed to include a bottom edge portion or lower peripheral skirt 144; the terms "lower," "bottom," and similar terms of orientation defined based upon proximity to the bottom principal surface or backside 148 of base flange 140. Lower peripheral skirt 144 is bonded to and extends around base flange 140, as taken about the centerline of ACM package 102; the centerline of ACM package 102 identified in FIG. 6 by dashed line 146 and extending substantially orthogonal to the upper principal surface or frontside 150 of base flange 140. In embodiments, lower peripheral skirt 144 may be formed as a continuous wall, which extends fully around the outer periphery of base flange 140. In other embodiments, peripheral skirt 144 may be formed as an interrupted or discontinuous wall; or molded package body 138 may be formed to omit such a lower peripheral skirt. The bottom principal surface or backside 148 of base flange 140 is exposed through a lower central opening, which is provided in molded package body 138 and which is peripherally bound by lower peripheral skirt 144. By exposing flange backside 148 from the exterior or underside of ACM package 102, mounting or attachment of ACM package 102 within system 100, while electrical connection to flange backside 148 may be facilitated as may be useful when, for example, flange 140 serves as a terminal or ground pad of ACM package 102. As a further benefit, the exposed region of flange backside 148 may promote heat removal from ACM package 102 by conductive heat transfer through base flange 140 and therefore through heat dissipation post 104.

Molded package body 138 further contains one or more inwardly-extending ledge portions, hereafter referred to as "lead isolation shelves 152." Lead isolation shelves 152 underlie the inner terminal end portions of package leads 136, which extend into the package interior and to which device interconnections are formed. These terminal end portions of package leads 136 are referred to hereafter as "proximal" lead ends; the term "proximal" and the antonym "distal," as utilized with reference to leads 136, defined based upon relative proximity to package centerline 146. Lead isolation shelves 152 extend from lower peripheral skirt 144 in an inward or inboard direction (that is, toward package centerline 146) and over an outer peripheral region of flange frontside 150. Lead isolation shelves 152 serve, in effect, as intervening dielectric layers, which reside between the respective lower surfaces of package leads 136 and flange frontside 150, as taken vertically through ACM package 102 along centerline 146. Lead isolation shelves 152 thus provide lead-flange electrical insulation, while further helping to mechanically join package leads 136 and base flange 140.

Molded package body 138 further includes an upper edge portion or peripheral rim 154, which is formed over proximal lead end portions 152 opposite lower peripheral skirt 144. Upper peripheral edge portion 154 extends around air cavity 142 and, in combination with cover piece 134, largely bounds or defines the periphery of cavity 142. Alternative embodiments of molded package body 138 may lack upper peripheral edge portion 154, which may be replaced by another, discretely-fabricated structure (e.g., a window frame) or may be rendered unneeded by direct bonding of lower peripheral edge 156 to proximal lead end portions 152. Generally, however, cover piece attachment can be enhanced through the provision of such an upper peripheral edge portion, which may be formed with lower peripheral skirt 144 and lead isolation shelves 152 as a single, integrally-formed molded structure or body. Lower peripheral edge 156 of cover piece 134 may be bonded to upper peripheral edge portion 154 of molded package body 138 by a ring of bonding material 166, referred to hereafter as "cover bond layer 166." Cover bond layer 166 can be composed of any material or materials suitable for mechanically attaching cover piece 134 to molded package body 138, while forming a gas-tight or substantially gas-tight seal around the periphery of the cover-body interface. For example, cover bond layer 166 may be composed of a metallic-based bonding material, which may be formed utilizing a low temperature sintering process similar to that mentioned above. Alternatively, cover bond layer 166 can be formed from a dispensed epoxy, a B-stage epoxy, or another die attachment material.

ACM package 102 can contain any number and type of microelectronic devices, which can be interconnected as appropriate to yield, for example, a System-in-Package (SiP). Such microelectronic devices can include IC-carrying semiconductor die, MEMS die, optical sensors, and passive devices, such as discrete inductors, resistors, diodes, and capacitors, to list but a few examples. In the relatively simple example shown in FIG. 6, ACM package 102 contains a single microelectronic device 158, such an RF power transistor die or another IC-bearing semiconductor die. Microelectronic device 158 includes bond pads 162, which are electrically interconnected with the exposed interior portions of package leads 136 utilizing wirebonds 164. In further embodiments, bond pads 162 may be electrically connected to the exposed interior portions of package leads 136 in another manner, such as by traces produced utilizing, for example, aerosol jet printing process depositing an electrically-conductive ink.

Microelectronic device 158 is attached to flange frontside 150 by at least one device bond layer 160. Device bond layer 160 can be composed of a die attachment material, such as an epoxy and a pressure-sensitive adhesive, in an embodiment. Alternatively, device bond layer 160 may be formed from a metallic-based bonding material; that is, a bonding material predominately composed of one or more metallic constituents, by wt %. In certain embodiments, device bond layer 160 is formed utilizing a low temperature sintering process in which metal particles (e.g., Cu, Ag, and/or Au particles in the nanometer or micron size range) are densified to form the desired bond layer. In such embodiments, device bond layer 160 may consist essentially of metallic materials; or, instead, may contain lesser amounts of non-metallic constituents, such as one or more organic materials added to enhance targeted bond layer properties. Device bond layer 160 can thus be formed from sintered metallic materials described above in conjunction with proximal bond layer 62 of microelectronic component 24 (FIG. 1). In embodiments, integrated heat dissipation post 104 and base flange 140 can be produced as discrete structures, which are joined utilizing a bonding material of the type previously described. Alternatively, as indicated in FIG. 6, integrated heat dissipation post 104 and base flange 140 can be integrally formed a single piece, which is jointly referred to herein as "studded base flange 104, 140." By definition, such an integral joinder between heat dissipation post 104 and base flange 140 eliminates the creation of a joint at the post-flange (or ground pad) interface. This, in turn, may further optimize conductive heat flow from package 102 into integrated heat dissipation post 104 during system operation.

In the illustrated example in which heat dissipation post 104 and base flange 140 are integrally formed or connected, the resulting studded base flange 104, 140 may assume the form of a single piece, unitary, or monolithic metallic structure or slug. For example, in such embodiments, studded base flange 104, 140 can be produced from a desired alloy utilizing a powder metallurgy process, such as Direct Metal Laser Sintering (DMLS). Advantageously, the usage of DMLS process or another additive manufacturing techniques allowing three dimensional metal printing can potentially enable a plurality of studded base flange to be printed in parallel for enhanced process efficiencies and lower fabrication costs. In other embodiments, studded base flange 104, 140 may be produced a single metal piece utilizing a different (e.g., additive or subtractive) manufacturing process. As a still further possibility, studded base flange 104, 140 can be fabricated to have a multilayer metallic construction; e.g., studded base flange 104, 140 may contain multiple thermally-conductive layers, which are bonded in a stacked or laminated arrangement. In this latter case, studded base flange 104, 140 will typically be composed predominately of one or more metals having relatively high thermal conductivies, such as a Cu alloy. As a more specific example, in an embodiment wherein studded base flange 104, 140 possess a layered or laminated structure, studded base flange 104, 140 may include at least one Cu layer combined with at least one disparate metal layer having a CTE less than that of the Cu layer. The disparate metal layer may be composed of, for example, Mo, a Mo—Cu alloy, or a Mo—Cu composite material. In this manner, studded base flange 104, 140 may be imparted with both a relatively high thermal conductivity and a lower effective CTE better matched to that of microelectronic device 158 and/or to that of molded package body 138.

The various terminals of ACM package 102 may be bonded to corresponding pads or electrically-conductive features on substrate 106 utilizing a number of electrically-conductive contacts. Solder contacts 168, 170, 172, 174 may be provided for this purpose, with solder contacts 168, 174 bonded to the I/O terminals (e.g., source and drain terminals) of package 102 provided in the form of leads 136, and solder contacts 170, 172 bounded to an outer portion of base flange 140. Further, interior portions of solder contacts 170, 172 may again encroach into socket cavity 130 to contact an outer peripheral portion of heat dissipation post 104 and, perhaps, to electrically couple base flange 140 to internal ground layer 114 through heat dissipation post 104. A thermally-conductive distal bond layer 178, analogous to distal bond layer 68 of microelectronic system 20 (FIG. 1), is provided in socket cavity 130. Thermally-conductive distal bond layer 178 may contact the distal end portion of heat dissipation post 104 and cavity floor 132 to fill or substantially fill any axial gap therebetween. Distal bond layer 178 thus helps ensure that a continuous, robust heat transfer path is provided from ACM package 102 through substrate 106.

A peripheral clearance or gap may be provided between the outer periphery of heat dissipation post 104 and the inner cavity sidewalls defining socket cavity 130. This peripheral clearance may be filled, in whole or in part, with thermally-conductive materials; e.g., as provided in the form of solder contacts 170, 172 and/or distal bond layer 178. Alternatively, selected regions 180 of this peripheral clearance be left as unfilled voids, as schematically depicted in FIG. 6. Finally, a thermally-conductive structure 182 is provided in substrate 106 and extends around the periphery of socket cavity 130. In one embodiment, thermally-conductive structure 182 may be realized as a tubular sleeve or cup-shaped metallic body, which extends around the distal end portion of heat dissipation post 104. Thermally-conductive structure 182 can be integrally formed with backside metal layer 128 in an embodiment. The provision of thermally-conductive structure 182 may spread heat flow conducted through heat dissipation post 104 and thereby enhance the overall thermal performance of microelectronic system 100.

Figure 7:
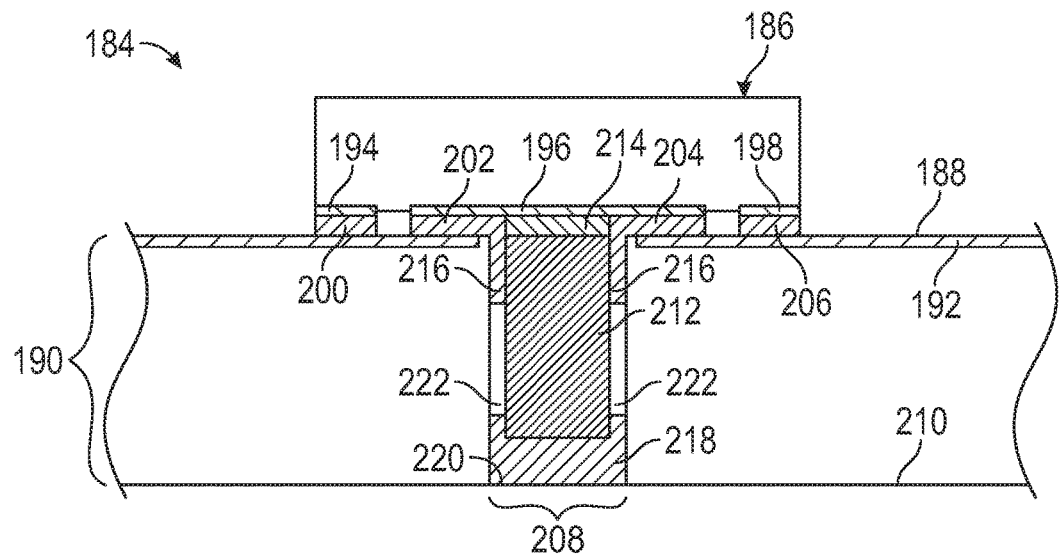
FIGS. 7 and 8 are cross-sectional views of a microelectronic system including a heat-generating microelectronic component and an integrated heat dissipation post, as depicted at different stages of manufacture and illustrated in accordance with a further exemplary embodiment of the present disclosure.

Turning next to FIG. 7, a further exemplary microelectronic system 184 is presented in cross-section. Once again, microelectronic system 184 includes a heat-generating microelectronic component 186, such as single device or device-containing package. Microelectronic component 186 is mounted to a frontside 188 of a substrate 190, which may be a single or multilayer PCB. As generically shown, substrate 190 includes an upper external metal layer 192, which is patterned to define traces, pads, or other points-of-contact electrically coupled to terminals 194, 196, 198 of component 186 through solder contacts 200, 202, 204, 206. Substrate 190 may also include a lower external metal layer and/or any practical number of internal patterned metal layers or levels, which are not shown for illustrative clarity. At least one opening or socket cavity 208 is formed in substrate 190. In this embodiment, socket cavity 208 is formed as through hole or fully penetrating tunnel, which breaches both substrate frontside 188 and an opposing backside 210 of substrate 190. A heat dissipation post 212 projects from microelectronic component 186 and, specifically, from central ground pad 196 to extend into socket cavity 208. As previously described, heat dissipation post 212 may be integrally formed with central ground pad 196 or joined thereto by thermally-conductive proximal bond layer 214. Thermally-conductive proximal bond layer 214 can be composed of various thermally-conductive materials including sintered materials having relatively high thermal and electrically conductivies.

Heat dissipation post 212 is received within socket cavity 208 and may be substantially co-axial therewith. The dimensions and planform geometry of heat dissipation post 212 may be selected such that a peripheral gap is created between the outer peripheral surfaces of post 212 and the inner cavity sidewalls of substrate 190 defining socket cavity 208. This circumferential clearance may or may not be filled, in whole or in part, by any number and type of thermally-conductive bodies of material. For example, as indicated in FIG. 7, solder contacts 202, 204 may be deposited in sufficient volume or otherwise formed to include encroachment regions 216, which extend downwardly into socket cavity 208 to contact an outer peripheral portion of the upper proximal end of heat dissipation post 212. In various implementations, heat dissipation post 212 may be electrically coupled through encroachment regions 216 to a non-illustrated internal metal level or wiring layer further contained in substrate 190. When viewed in three dimensions, encroachment regions 216 may form a continuous, 360° ring surrounding or extending around proximal bond layer 214. A thermally-conductive distal bond layer 218 further fills or occupies a lower portion of socket cavity 208 and contacts the distal end portion of heat dissipation post 212. Thermally-conductive distal bond layer 218 includes a lower principal surface (that is, the surface located furthest from microelectronic component 186), which may be substantially flush or coplanar with substrate backside 210. Finally, intermediate regions 222 of the clearance or peripheral gap between heat dissipation post 212 and the inner cavity sidewalls may be left as unfilled voids. Alternatively, regions 222 may be filled with an electrically-conductive material by, for example, applying a powder packing or other precursor material into socket cavity 208 prior to seating component 186 onto substrate 190.

Microelectronic system 184 can be fabricated utilizing a process similar to that described above in conjunction with FIGS. 4-5. Additional measures may be appropriately taken during the fabrication process, however, to compensate for any contact between the temporary substrate or carrier on which system 184 is produced and distal bond layer 218 due to the fully penetrating nature of socket cavity 208. In one approach, and referring now to FIG. 8 in which partially-fabricated components or structural features are identified by the prime symbol ('), the microelectronic system fabrication process may be conducted, in part, utilizing a temporary substrate or carrier 224. A removal layer 226 is provided on the upper surface of carrier 224. Removal layer 226 contains thermally-conductive distal bond layer 218 during the below-described curing or reflow process and may also facilitate detachment of microelectronic system 184' following distal bond layer curing. Thermally-conductive distal bond layer 218 is conveniently formed from a solder material and is consequently described below as such. However, as previously indicated, thermally-conductive distal bond layer 218 can be formed from other thermally-conductive materials, such as sintered materials, in alternative embodiments of system 184.

Figure 8:
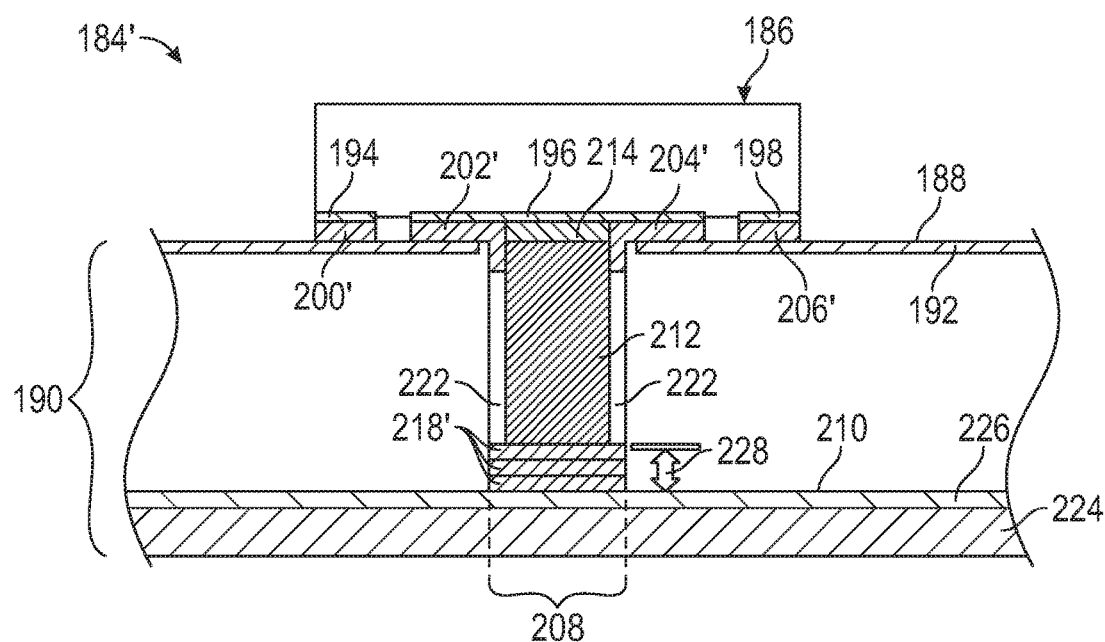

Microelectronic system 184' is illustrated prior to solder reflow in FIG. 8, as indicated by the usage of a prime symbol (') following reference numerals 200, 202, 204, 206, 218. Prior to seating microelectronic device 186 on substrate 190, substrate 190 is positioned on carrier 224; and solder precursor material 218' is positioned in socket cavity 208. Solder precursor material 218' may be provided in the form of compressed powder preforms having a shim-like or stackable sheet form factor; or, instead, as powder packing. As indicated in FIG. 8 by double-headed arrow 228, the number of preforms or the volume of powder packing may be adjusted, as appropriate, to accommodate variations in substrate thickness 190 relative to the length of heat dissipation post 212. This approach compensates for disparities in elevation between the distal end of heat dissipation post 212 and substrate backside 210 thereby allowing the usage of heat dissipation posts of a set minimal length to be utilized with substrates of varying thicknesses. Removal layer 226 may be composed of a non-solder-wettable material to prevent or at least minimize bonding of solder precursor material 218' with layer 226 through the solder reflow process. Suitable non-solder-wettable materials include certain metals and alloys, such as nickel; certain metal oxides; and polymers, such as polytetrafluoroethylene (PTFE). After solder reflow, microelectronic system 184 may be detached from carrier 224 and subject to further processing, as needed, to yield the finished structure shown in FIG. 7. In other embodiments, removal layer 226 may be composed of a different material facilitating detachment of microelectronic system 184 from carrier 224 following solder reflow or, perhaps, a different curing process through which precursor material 218' is converted into distal bond layer 218.

Figure 9:
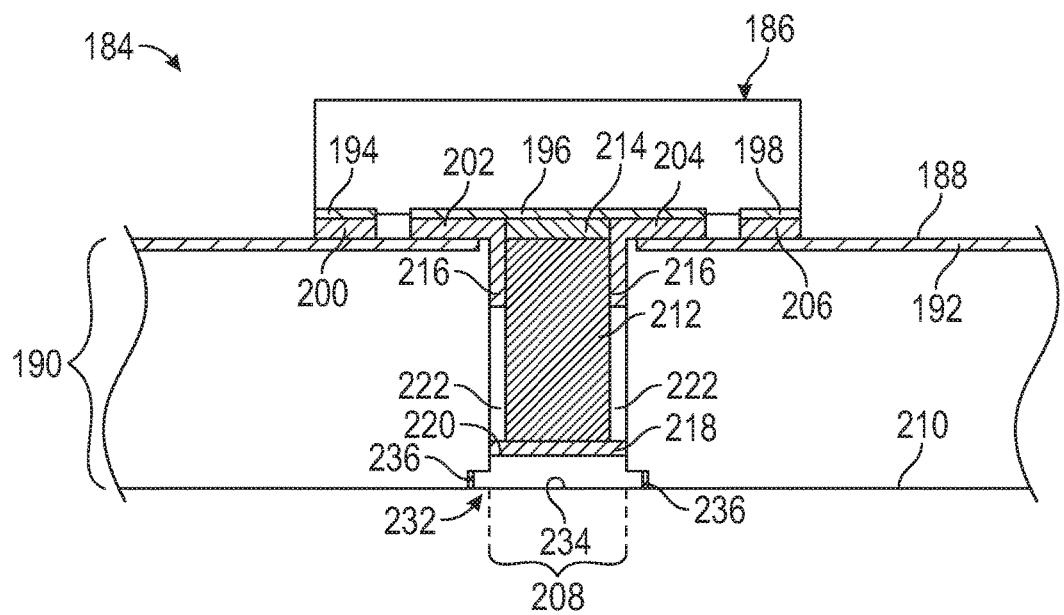
FIG. 9 is a cross-sectional view of a microelectronic system including a heat-generating microelectronic component, an integrated heat dissipation post, and a thermally-conductive plug member, as illustrated in accordance with a still further exemplary embodiment of the present disclosure.

Progressing lastly to FIG. 9, a microelectronic system 230 is illustrated in accordance with a still further exemplary embodiment of the present disclosure. Microelectronic system 230 is similar to microelectronic system 284 described above in conjunction with FIGS. 7-8; thus, like reference numerals have been utilized to identify like structural elements in this drawing figure. Furthermore, much of the description set-forth above will not be repeated to avoid redundancy. It is briefly noted, though, that socket cavity 208 is again formed as a fully penetrating tunnel or through hole in the example of FIG. 9. Again, heat dissipation post 212 is received by and extends within socket cavity 208; e.g., in embodiments, heat dissipation post 212 may be substantially coaxial with socket cavity 208 and/or may occupy a volumetric majority thereof. As was previously the case, thermally-conductive distal bond layer 218 is further provided in cavity 208 in contact with the distal end portion of post 212. However, in this embodiment, lowermost surface 220 of distal bond layer 218 is not coplanar with substrate backside 210, but is rather recessed relative thereto. Furthermore, in the instant example, a thermally-conductive plug member 232 is installed in a lower portion of socket cavity 208. Thermally-conductive plug member 232 includes a lower principal surface 234, which is substantially coplanar with substrate backside 210. As can be seen, plug member 232 contacts and is retained in place by distal bond layer 218, which is located between the distal end portion of heat dissipation post 212 and plug member 232 as taken along the centerline of post 212. Furthermore, as indicated in FIG. 9 by dot stippling, an outer peripheral portion 236 of plug member 232 may be knurled, slotted, or otherwise imparted with a surface texture or features that further help retain plug member 232 in its desired position via interference fit with the inner cavity sidewalls defining socket cavity 208.

Figure 10:
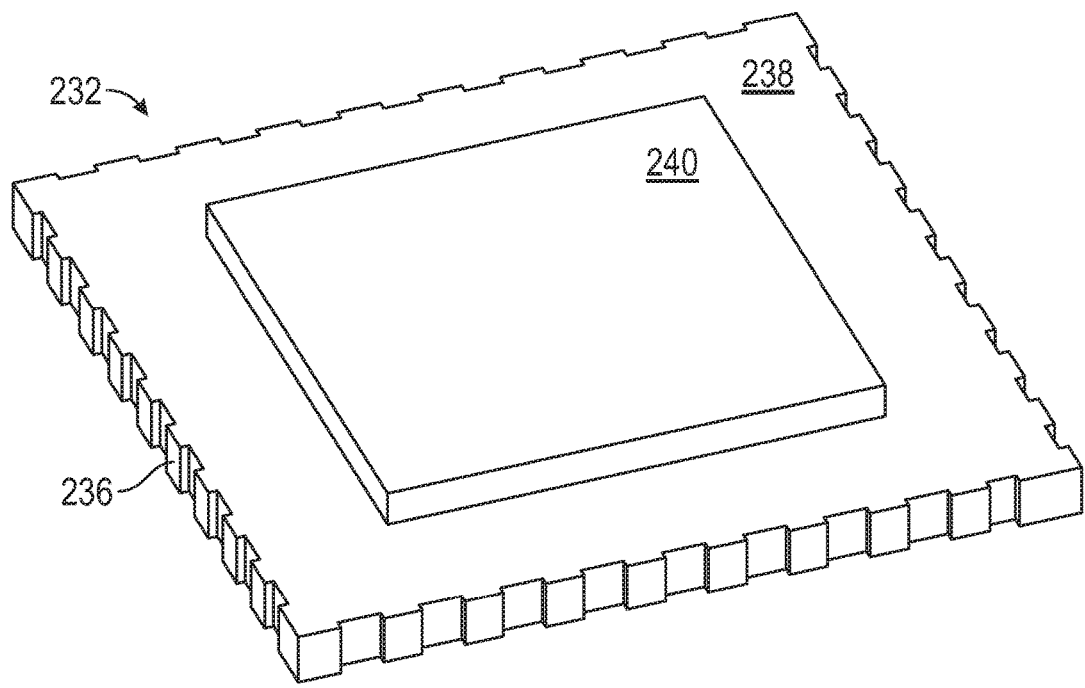
FIG. 10 is an isometric view of the thermally-conductive plug member included in the microelectronic system illustrated in FIG. 9.

The usage of a thermally-conductive plug member, such as plug member 232 shown in FIG. 9, can facilitate the fabrication process when cavity 208 is fully penetrating by eliminating or reducing contact between the precursor material utilized to form distal bond layer 218 and the carrier or temporary substrate on which microelectronic system 230 is fabricated. Thermally-conductive plug member 232 may also further help dissipate heat conducted away from microelectronic component 186 through heat dissipation post 212 by spreading such excess heat over a greater volume of material. Plug member 232 may be composed of the various thermally-conductive materials described herein including non-metallic materials and metallic materials, such as Cu alloys. The shape and dimensions of thermally-conductive plug member 232 can also be varied, by design, providing that at least a portion of plug member 232 can be inserted into socket cavity 208 from backside 210 of substrate 190. Thus, plug member 232 can be produced to have block-shaped, pyramidal, and stepped geometries in embodiments. To provide a more specific example, and referring briefly to FIG. 10 illustrating plug member 232 isometrically, thermally-conductive plug member 232 can be produced to have a stepped geometry including a lower base portion 238 having larger planform dimensions and an upper portion 240 having reduced planform dimensions, as shown. In this case, the lower portion of socket cavity 208 may be imparted with a similar shape and dimensions such that a mating or close-tolerance fit is achieved between thermally-conductive plug member 232 and the inner cavity sidewalls defining socket cavity 208 when plug member 232 is inserted therein. In further embodiments, thermally-conductive plug member 232 may have other shapes, dimensions, and retention features permitting insertion of plug member 232 from substrate backside 210. Collectively, then, proximal bond layer 214, heat dissipation posts 212, distal bond layer 218, and plug member 232 provide a highly conductive heat stack or thermal conduction path extending through substrate 190 from microelectronic component 186 to substrate backside 210 to enhance the thermal performance characteristics of microelectronic system 184.

CONCLUSION

There has thus been provided microelectronic systems having integrated heat dissipation posts, as well as methods for fabricating such microelectronic systems. The above-described microelectronic systems can be produced to have relatively high thermal performance levels, even when containing microelectronic devices prone to the generation of excess heat, due at least in part to the provision of the above-described heat dissipation posts and thermally-conductive bond layer(s) in contact therewith. Joinder of the heat dissipation posts to the microelectronic components prior to component attachment can streamlined the manufacturing process to reduce cost and improve efficiency. Additionally, in embodiments in which the heat dissipation post is bonded to a ground pad or base flange included in the component, sintered metallic materials can be utilized to form the desired bond, while providing high thermal and electrical conductivities across the pad-post interface. In embodiments, the heat dissipation post can also be leveraged to provide a relatively robust electrical connection path between the microelectronic component and another electrically-active feature or structure of the substrate to which the component is mounted, such a ground layer contained within the substrate.

In embodiments, the method for fabricating a microelectronic system includes the steps or processes of obtaining a microelectronic component from which a heat dissipation post projects and seating the microelectronic component on a substrate having a socket cavity, which may or may not penetrate fully through the substrate. The heat dissipation post is received in the socket cavity as the microelectronic component is seated on the substrate. Concurrent with or after seating the microelectronic component, the microelectronic component and the heat dissipation post are bonded to the substrate. In certain implementations, the heat dissipation post may be dimensioned such that, when the microelectronic component is seated on the substrate, the heat dissipation post occupies a volumetric majority of the socket cavity. Similarly, in other embodiments, the heat dissipation post may be dimensioned such that, when the microelectronic component is seated on the substrate, the heat dissipation post is separated from inner cavity sidewalls, which define the socket cavity, by a peripheral clearance or circumferential gap. In this latter case, the method may further include the step or process of forming a bond layer in contact with the inner cavity sidewalls, in contact with an outer peripheral portion of the heat dissipation post, and at least partially filling the peripheral clearance.

Embodiments of a microelectronic package, such as a PAM package, have been further provided. In one embodiment, the microelectronic package includes a (e.g., molded) package body, a ground pad or base flange exposed through a surface of the package body, a semiconductor die or other microelectronic device contained in the package body and electrically coupled to the ground pad, and a heat dissipation post. The heat dissipation post projects from the ground pad along an axis substantially parallel to a centerline of microelectronic package and in a direction away from the microelectronic device. In certain embodiments, the heat dissipation post may be integrally formed with the ground pad as, for example, a unitary structure. Alternatively, the heat dissipation post may be formed as a discrete structure or piece, which is joined to the ground pad by a sintered bond layer. In this latter case, the sintered bond layer may be composed predominately of or consist essentially of at least one of the group consisting of Ag, Au, and Cu, by wt %.

Finally, embodiments of a microelectronic system have been further provided. In one embodiment, the microelectronic system includes a microelectronic component having a ground pad or base flange. a substrate to which the microelectronic component is mounted. a socket cavity formed in the substrate, and a heat dissipation post extending from the microelectronic component into the socket cavity. The heat dissipation post includes, in turn, a proximal end portion joined to the ground pad and an opposing distal end portion, which is located opposite the proximal end portion and contained within the socket cavity. The distal end portion is separated from the cavity floor by an axial gap or clearance. The microelectronic system further includes a thermally-conductive bond layer, which contacts the cavity floor, the distal end portion of the heat dissipation post, and substantially fills the axial gap.

The term "air cavity package," as appearing throughout this document, refers to a microelectronic package including a sealed cavity that is at least partially filled with a gas, regardless of the internal pressure within the cavity. The "air cavity" of the air cavity package may be enclosed in an open air environment and, thus, may contain air at approximately 1 atmosphere pressure with slight variations depending upon elevation and processing temperatures during package manufacture. In other implementations, the "air cavity" of the air cavity package may be enclosed in a partially evacuated chamber or a chamber containing an inert gas, such as argon, during manufacture and, thus, may not contain pure air in all instances. The term "air cavity," then, should be understood as referring to a gas-containing cavity, which may or may not be partially evacuated and which is sealed from the ambient environment. Additionally, the seal formed between the air cavity and the ambient environment may not be hermetic, as strictly defined, but rather may be a low leakage seal having a gross leakage rate falling within acceptable parameters. Thus, as appearing herein, a cavity is considered "sealed" when little to no leakage (bubbles) are observed from the cavity's exterior when the cavity is filled with air or another gas and the air cavity package is fully immersed in a liquid (e.g., PFPE) at approximately 125° C. Finally, the term "molded air cavity package" and the corresponding term "ACM package" refer to an air cavity package, as previously defined, and further including a package body principally or exclusively formed from one or more molded materials.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating a microelectronic system, comprising:
    obtaining a microelectronic component from which a heat dissipation post projects;
    seating the microelectronic component on a substrate having a socket cavity therein, the heat dissipation post received in the socket cavity as the microelectronic component is seated on the substrate; and
    concurrent with or after seating the microelectronic component, bonding the microelectronic component and the heat dissipation post to the substrate.

2. The method of claim 1 further comprising dimensioning the heat dissipation post such that, when the microelectronic component is seated on the substrate, the heat dissipation post occupies a volumetric majority of the socket cavity.

3. The method of claim 1 wherein the substrate comprises inner cavity sidewalls defining the socket cavity; and
wherein the method further comprises dimensioning the heat dissipation post such that, when the microelectronic component is seated on the substrate, the heat dissipation post is separated from the inner cavity sidewalls by a peripheral clearance.

4. The method of claim 3 wherein bonding comprises forming a bond layer in contact with the inner cavity sidewalls, in contact with an outer peripheral portion of the heat dissipation post, and at least partially filling the peripheral clearance.

5. The method of claim 1 wherein the heat dissipation post is substantially coaxial with the socket cavity.

6. The method of claim 1 wherein the socket cavity terminates within the substrate at a cavity floor; and
wherein the method further comprises dimensioning the heat dissipation post such that, when the microelectronic component is seated on the substrate, a distal end portion of the heat dissipation post is separated from the cavity floor by an axial gap, as taken along an axis orthogonal to a frontside of the substrate.

7. The method of claim 6 wherein the substrate comprises a backside metal layer defining the cavity floor; and
wherein the method further comprises electrically and thermally coupling the distal end portion of the heat dissipation post to the backside metal layer when bonding the microelectronic component and the heat dissipation post to the substrate.

8. The method of claim 6 wherein bonding comprises forming a thermally-conductive distal bond layer contacting the cavity floor, the distal end portion of the heat dissipation structure, and substantially filling the axial gap.

9. The method of claim 1 wherein bonding comprises:
depositing solder bodies on the substrate at predetermined positions prior to seating the microelectronic component on the substrate;
applying a bond layer precursor material into the socket cavity prior to or in conjunction with seating the microelectronic component on a substrate; and
after seating the microelectronic component, performing a heat treatment process to concurrently: (i) reflow the solder bodies to yield solder contacts attaching the microelectronic component to the substrate, and (ii) cure the bond layer precursor material to produce a thermally-conductive distal bond layer contacting a distal end portion of the heat dissipation post.

10. The method of claim 1 wherein bonding comprises forming solder contacts attaching the microelectronic component to the substrate; and
wherein the method further comprises selecting the heat dissipation post to have a higher thermal conductivity than that of the solder contacts.

11. The method of claim 1 wherein the microelectronic component comprises a ground pad; and
wherein bonding comprises forming a solder contact in contact with the ground pad, the substrate, and the heat dissipation post.

12. The method of claim 11 wherein the heat dissipation post is joined to the ground pad through a thermally-conductive proximal bond layer composed of a material having a higher thermal conductivity than does the solder contact; and
wherein bonding comprises forming the solder contact to extend at least partially around a periphery of the thermally-conductive proximal bond layer.

13. The method of claim 11 wherein bonding comprises forming the solder contact to include an encroachment portion extending into the socket cavity and contacting a peripheral portion of the heat dissipation post.

14. The method of claim 13 wherein the substrate contains an internal ground layer; and
wherein forming comprises forming the solder contact such that the ground pad of the microelectronic device is electrically coupled to the internal ground layer through the heat dissipation post and through the encroachment portion of the solder contact.

15. The method of claim 1 wherein obtaining comprises:
selecting the microelectronic component to comprise a ground pad and a thermally-conductive proximal bond layer, which joins the heat dissipation post to the ground pad;
wherein the thermally-conductive proximal bond layer comprises a sintered metallic material having a thermal conductivity exceeding about 30 watts per meter-Kelvin.

16. The method of claim 1 wherein obtaining comprises selecting the microelectronic component to comprise a ground pad integrally formed with the heat dissipation post.

* * * * *